US011276598B2

(12) United States Patent
Caveney

(10) Patent No.: US 11,276,598 B2
(45) Date of Patent: *Mar. 15, 2022

(54) SUBSTRATE TRANSPORT APPARATUS

(71) Applicant: Brooks Automation, Inc., Chelmsford, MA (US)

(72) Inventor: Robert T. Caveney, Windham, NH (US)

(73) Assignee: Brooks Automation US, LLC, Chelmsford, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/996,409

(22) Filed: Aug. 18, 2020

(65) Prior Publication Data
US 2021/0066105 A1 Mar. 4, 2021

Related U.S. Application Data

(63) Continuation of application No. 15/743,727, filed as application No. PCT/US2016/041683 on Jul. 11, 2016, now Pat. No. 10,748,799.
(Continued)

(51) Int. Cl.
H01L 21/677 (2006.01)
H01L 21/67 (2006.01)

(52) U.S. Cl.
CPC .. H01L 21/67742 (2013.01); *H01L 21/67167* (2013.01); *H01L 21/67748* (2013.01)

(58) Field of Classification Search
None
See application file for complete search history.

(56) References Cited

U.S. PATENT DOCUMENTS 5,024,116 A 6/1991 Kraft
7,736,118 B2 6/2010 Uratani et al.
(Continued)

FOREIGN PATENT DOCUMENTS

JP 10128692 5/1998
JP 2001112223 4/2001
(Continued)

OTHER PUBLICATIONS

SuppESR_EP16824976_Feb. 14, 2019.

*Primary Examiner* — Gerald McClain
(74) *Attorney, Agent, or Firm* — Perman & Green, LLP; Colin C. Durham

(57) ABSTRACT

A transport apparatus including a drive section connected to a frame and including a multi-drive shaft spindle, with a coaxial shaft spindle, at least one interchangeable composite motor module of more than one different interchangeable motor modules arranged in a series, each having a motor operably coupled thereto and defining a corresponding independent drive axis, and a can seal disposed between the stator and rotor of each motor module at least one of the motor modules is selectable, for coupling to the coaxial shaft spindle, from other different interchangeable composite motor modules, each having a different predetermined characteristic, independent of coupling to the coaxial shaft spindle, that defines a different predetermined drive characteristic of one or more of the corresponding drive axis, independent of shaft spindle location, so that selection of the at least one composite motor module determines the different predetermined drive characteristic of the coaxial shaft spindle.

26 Claims, 19 Drawing Sheets

Related U.S. Application Data

(60) Provisional application No. 62/191,836, filed on Jul. 13, 2015.

(56) References Cited

U.S. PATENT DOCUMENTS

| | | | |
|---|---|---|---|
| 8,008,884 B2* | 8/2011 | Krupyshev | H01L 21/67742 318/568.21 |
| 9,742,250 B2* | 8/2017 | Kremerman | B25J 9/126 |
| 9,751,209 B2* | 9/2017 | Caveney | B25J 18/04 |
| 9,948,155 B2* | 4/2018 | Moura | H02K 19/103 |
| 10,468,936 B2* | 11/2019 | Moura | H02K 1/24 |
| 10,493,620 B2 | 12/2019 | Caveney | |
| 2012/0014769 A1 | 1/2012 | Van Der Meulen | |
| 2012/0128450 A1 | 5/2012 | Caveney et al. | |
| 2013/0028700 A1 | 1/2013 | Gilchrist et al. | |
| 2014/0126987 A1 | 5/2014 | Gilchrist et al. | |
| 2014/0150592 A1* | 6/2014 | Kremerman | H01L 21/67703 74/490.03 |
| 2015/0139770 A1 | 5/2015 | Moura et al. | |
| 2016/0136806 A1* | 5/2016 | Caveney | B25J 9/126 74/490.03 |
| 2018/0233986 A1* | 8/2018 | Moura | H02K 1/246 |

FOREIGN PATENT DOCUMENTS

| | | |
|---|---|---|
| JP | 2006314157 | 11/2006 |
| JP | 2014520681 | 8/2014 |
| TW | I470723 | 1/2010 |
| TW | 201421605 | 6/2014 |

\* cited by examiner

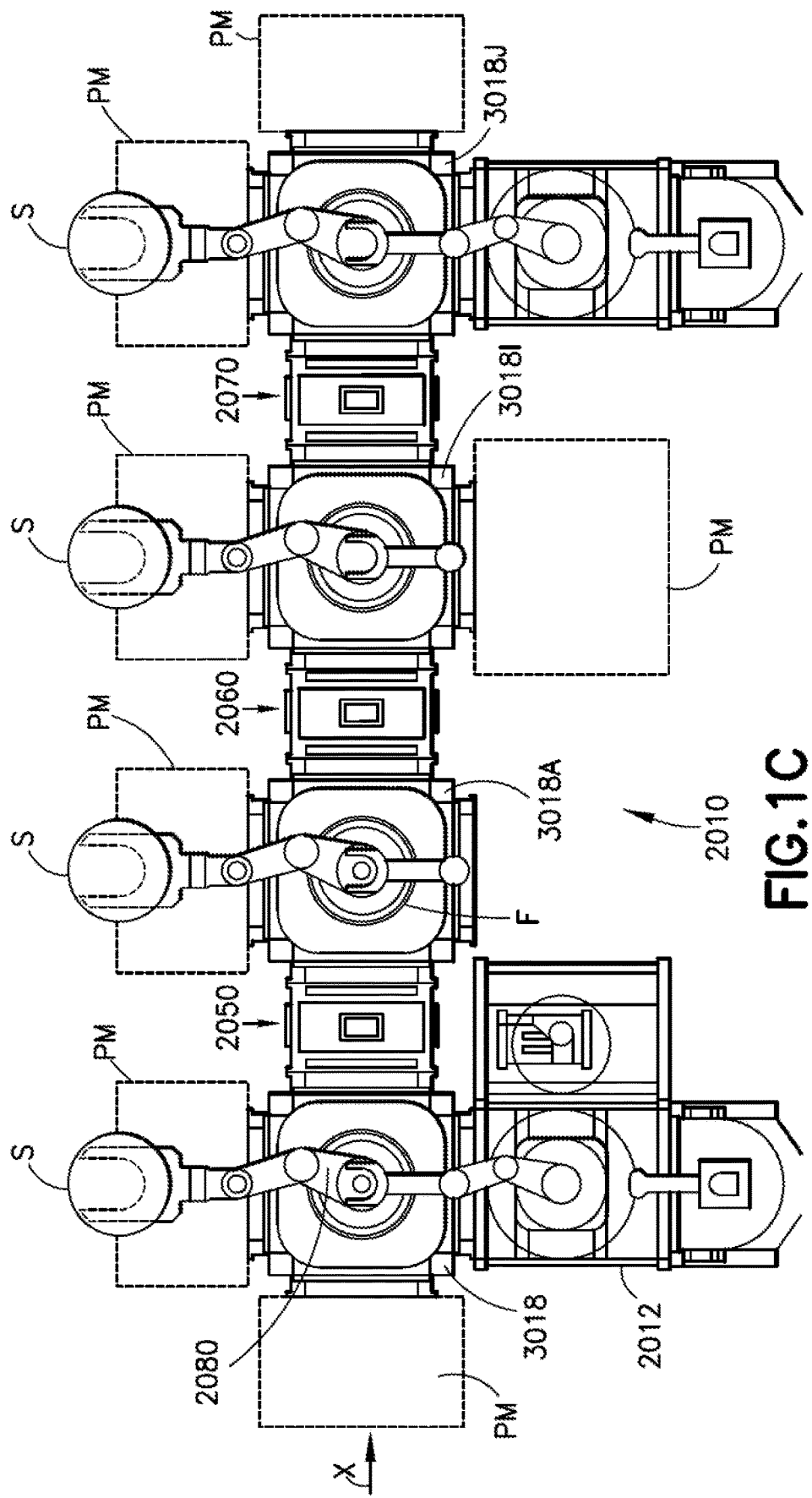

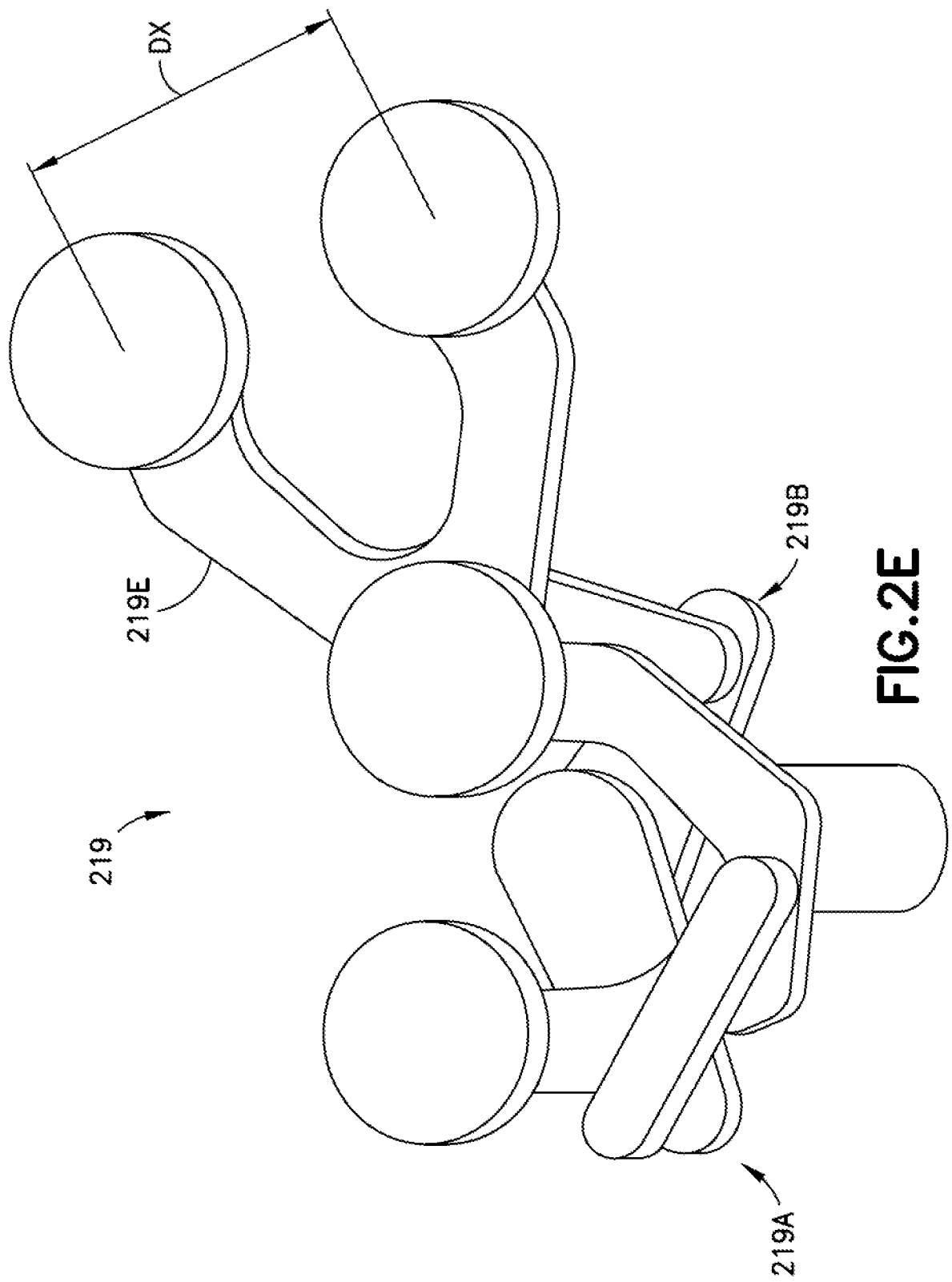

SUBSTRATE TRANSPORT APPARATUS

CROSS-REFERENCE TO RELATED APPLICATIONS

This application is a continuation of U.S. Non-provisional patent application Ser. No. 15/743,727, filed Jan. 11, 2018 (now U.S. Pat. No. 10,748,799), which is the National Stage of International Application No. PCT/US2016/041683, having an International Filing Date of 11 Jul. 2016, which designated the United States of America, and which International Application was published under PCT Article 21 (2) as WO Publication No. 2017/011367 A1, and which claims priority from and the benefit of U.S. provisional patent application No. 62/191,836 filed on 13 Jul. 2015 the disclosures of which are incorporated herein by reference in their entireties.

BACKGROUND

1. Field

The exemplary embodiments generally relate to substrate processing systems and, more particularly, to substrate transport apparatus that are reconfigurable and interchangeable without in situ calibration of motor components.

2. Brief Description of Related Developments

Generally substrate or wafer transport apparatus, such as for exemplary purposes only, transport apparatus that transport substrates in a semiconductor processing apparatus, is specifically configured for a particular arrangement. For example, the number of drive axes and the motor characteristics are fixed upon assembly of the transport apparatus. In effect these substrate transport apparatus cannot be reconfigured without substantially tearing down the substrate transport apparatus and rebuilding it anew. This limits the interchangeability and interoperability of conventional substrate transport apparatus and results in fabrication facility (i.e. a FAB) operations having many generally similar yet not interchangeable transport apparatus. By way of example, a FAB operator may have conventional 3 axis, 4 axis and 5 axis robots (each for a corresponding processing station or tool where a 3 axis, 4 axis or 5 axis transport apparatus is appropriate). Although generally similar in configuration (e.g. the conventional robot may all have the same type of arm such as SCARA, leap frog, etc.), nevertheless the conventional 3 axis, 4 axis and 5 axis transport apparatus are not interchangeable, and reconfiguring of the conventional transport apparatus (e.g. reconfiguring a 3 axis transport apparatus to a 5 axis transport apparatus or vice versa) involves a complete tear down and rebuilding of the conventional transport apparatus.

In addition, where the conventional transport apparatus include vertical or Z axis travel the motors that provide for the rotation of the transport arm of the transport apparatus are generally mounted in a carriage that is drivingly coupled to a Z axis drive. The carriage is generally sized for a predetermined number of motors where the number of motors within the carriage generally cannot be changed. From at least a transport apparatus production standpoint and from the standpoint of the end user, multiple carriages and drive housing frames are needed to accommodate transport apparatus having different numbers of stacked motors as well as different amounts of Z-axis travel.

It would be advantageous to have a transport apparatus with reduced height modular motors that can be inserted to and removed from a common carriage that accommodates a varying motor stack height. It would also be advantageous to have a transport apparatus with reduced height modular motors that can be exchanged and used in combination with one another to effect a reconfiguration of the transport apparatus.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of a substrate processing apparatus incorporating aspects of the disclosed embodiment;

FIGS. 2A-2E are schematic illustrations of transport arms in accordance with aspects of the disclosed embodiment;

DETAILED DESCRIPTION

Referring to FIGS. 1A-1D, there are shown schematic views of substrate processing apparatus or tools incorporating the aspects of the disclosed embodiment as will be further described herein. Although the aspects of the disclosed embodiment will be described with reference to the drawings, it should be understood that the aspects of the disclosed embodiment can be embodied in many forms. In addition, any suitable size, shape or type of elements or materials could be used.

As will be described in greater detail below, the aspects of the disclosed embodiment provide for a substrate transport apparatus having a reconfigurable drive spindle that allows for a low torque application or a high torque application of at least one drive axis where the drive spindle is driven by and connected to a modular drive section. The modular drive section includes more than one different interchangeable motor module arranged in a stack where each motor module includes a sealed motor that drives a respective shaft of a coaxial spindle assembly of the transport apparatus and defines a corresponding drive axis of the drive section. The different interchangeable motor modules are selectable for placement in the stack from other different interchangeable motor modules where each of the motor modules has a different predetermined characteristic independent of the placement of the drive module in the stack. The predetermined characteristic of each drive corresponds to the drive axis (e.g. a drive axis common to the respective motor module) independent of shaft location within the coaxial spindle assembly. The aspects of the disclosed embodiment also provide for the installation of motor modules so that on installation of the motor module no further tuning of the motor module is required. The aspects of the disclosed embodiment provide for a modular motor configuration that reduces the height of a transport apparatus drive section as well as reduces costs for the production and maintenance of the transport apparatus while providing an increased gain in linear range of motor torque performance. A Z axis carriage is also provided by the aspects of the disclosed embodiment where the Z axis carriage provides a common solution for motor stacks having varying heights without adding cost so the transport apparatus. Accordingly the aspects of the disclosed embodiment leverage common components for the Z axis carriage interface with the motor modules described herein with multiple different combinations of lengths and spindle assembly types in a common frame.

Figure 1A:
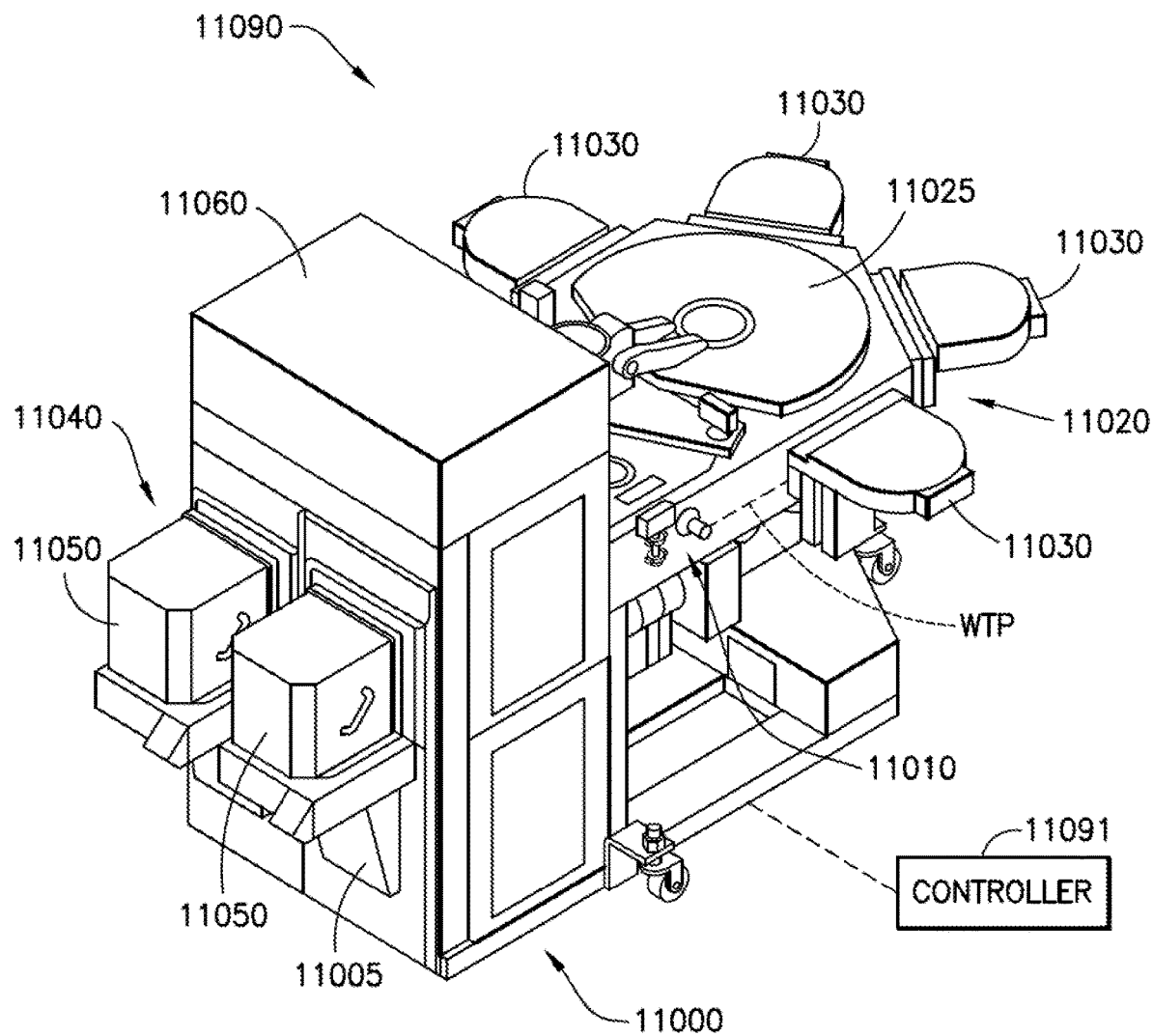
Figure 1B:
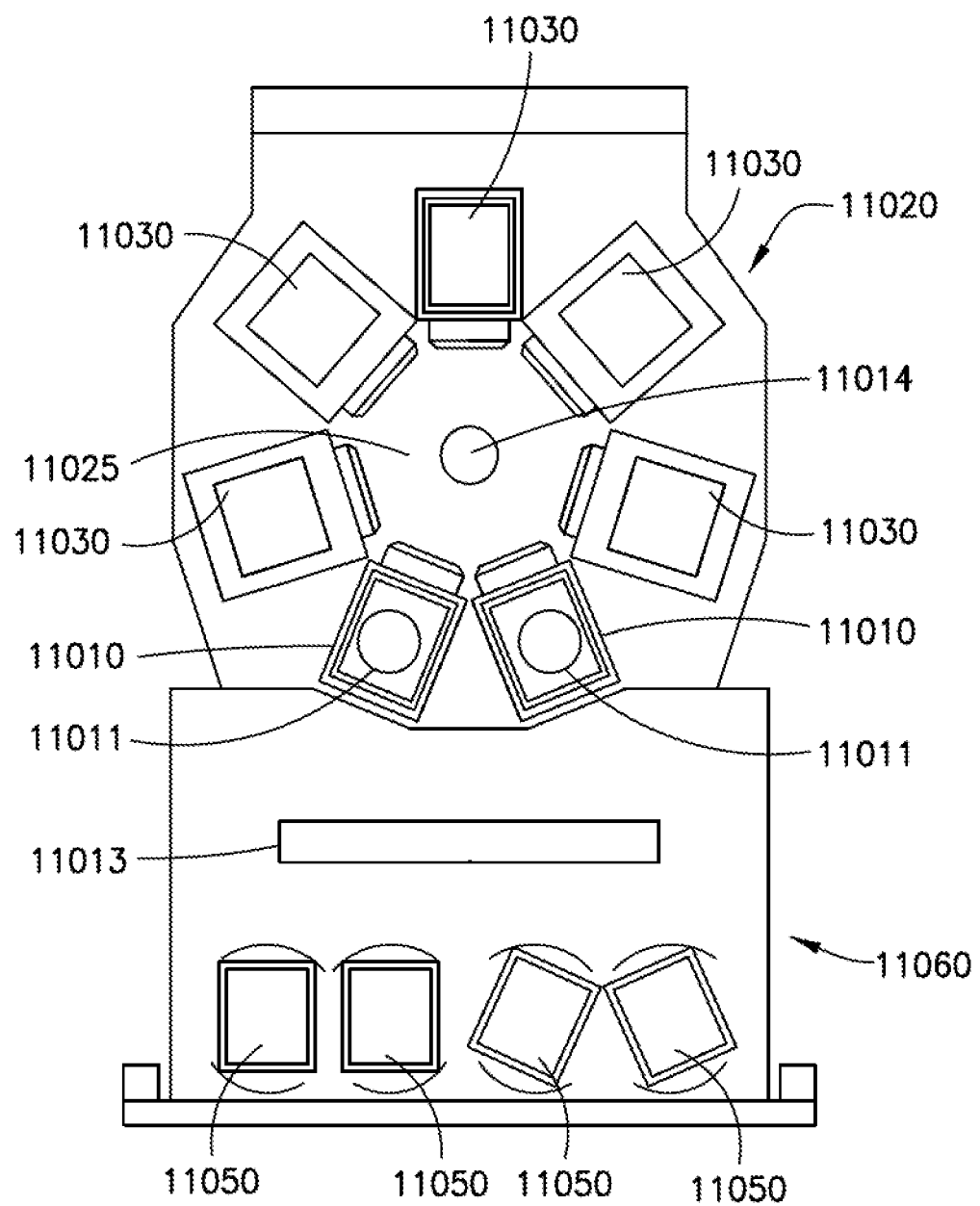

Referring to FIGS. 1A and 1B, a processing apparatus, such as for example a semiconductor tool station 11090 is shown in accordance with aspects of the disclosed embodiment. Although a semiconductor tool 11090 is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

The controller 11091 and/or a controller 300C (FIG. 3A) of a substrate transport apparatus, such as those described herein, includes any suitable memory 300CM and processor (s) 300PR that include non-transitory program code for operating the processing apparatus described herein to effect the installation of the different motor modules so that on installation of the motor modules, no further tuning of the motor modules is/are required. For example, in one aspect, the controller 11091 and/or controller 300C is includes memory 300CM and processor 300PR that are configured to store, retrieve and validate motor module specific attributes (e.g. any suitable drive characteristics such as a phase difference/angle between the motor encoder and motor winding phase angles). These motor module specific attributes are, in one aspect, stored on a memory 401CR (which may be a card, chip or other suitable storage medium) of each respective motor module 401 so that when the respective motor module is installed in the drive section the memory 401CR is in communication with controller 300C and/or controller 11091. The controller 300C is configured to establish a rotational position of the motor module based on the motor module specific attributes stored in and obtained from the memory 401CR of the respective motor module 401. As an example, referring to FIG. 4A, each motor module 401 described herein has a specific number that is created at the birth or assembly of the motor module 401 where this specific number correlates the alignment of the electrical winding phase angle of the motor module's motor 401M to the encoder 410 (see e.g. FIG. 4A). This specific number optimizes the commutation of the motor 401M during initialization and operation. Having an incorrect number will generate substrate transport stoppage errors and if slightly off, generate excessive heating due to inefficiency of power distribution between the phases. This specific number and any other suitable motor module specific attributes, such as those describe above, are stored on the memory 401CR of each motor module 401. The substrate transport controller 300C (or controller 11091) uses the specific number for each motor module 401 in the motor stack 310 (and the specific phase values associated with the respective specific numbers/motors modules) as the foundation to generate commanded trajectory motion parameters to achieve a desired torque, position and time requirement (s). As such, each motor module 401 described herein is truly interchangeable and can be installed in a substrate transport apparatus without further tuning of the motor module.

In one aspect, the front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer or 450 mm wafer interfaces or any other suitable substrate interfaces such as for example larger or smaller wafers or flat panels for flat panel displays. Although two load port modules 11005 are shown in FIG. 1A, in other aspects any suitable number of load port modules may be incorporated into the front end 11000. The load port modules 11005 may be configured to receive substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. In one aspect the load ports 11040 allow the passage of substrates between the substrate cassettes 11050 and the mini-environment 11060.

In one aspect, the mini-environment 11060 generally includes any suitable transfer robot 11013 that incorporates one or more aspects of the disclosed embodiment described herein. In one aspect the robot 11013 may be a track mounted robot such as that described in, for example, U.S. Pat. No. 6,002,840, the disclosure of which is incorporated by reference herein in its entirety or in other aspects, any other suitable transport robot having any suitable configuration. The mini-environment 11060 may provide a controlled, clean zone for substrate transfer between multiple load port modules.

The vacuum load lock 11010 may be located between and connected to the mini-environment 11060 and the back end 11020. It is again noted that the term vacuum as used herein may denote a high vacuum such as $10^{-5}$ Torr or below in which the substrates are processed. The load lock 11010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. In one aspect, the load lock 11010 includes an aligner 11011 for aligning a fiducial of the substrate to a desired position for processing. In other aspects, the vacuum load lock may be located in any suitable location of the processing apparatus and have any suitable configuration and/or metrology equipment.

The vacuum back end 11020 generally includes a transport chamber 11025, one or more processing station(s) or module(s) 11030 and any suitable transfer robot or apparatus 11014. The transfer robot 11014 will be described below and may be located within the transport chamber 11025 to transport substrates between the load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa. In one aspect the load port modules 11005 and load ports 11040 are substantially directly coupled to the vacuum back end 11020 so that a cassette 11050 mounted on the load port interfaces substantially directly (e.g. in one aspect at least the mini-environment 11060 is omitted while in other aspects the vacuum load lock 11010 is also omitted such that the cassette 11050 is pumped down to vacuum in a manner similar to that of the vacuum load lock 11010) with a vacuum environment of the transfer chamber 11025 and/or a processing vacuum of a process module 11030 (e.g. the processing vacuum and/or vacuum environment extends between and is common between the process module 11030 and the cassette 11050).

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM (which in one aspect are substantially similar to processing modules 11030 described above). As may be realized, each chamber module may be capable of holding an isolated or controlled atmosphere (e.g. N2, clean air, vacuum).

Figure 1D:
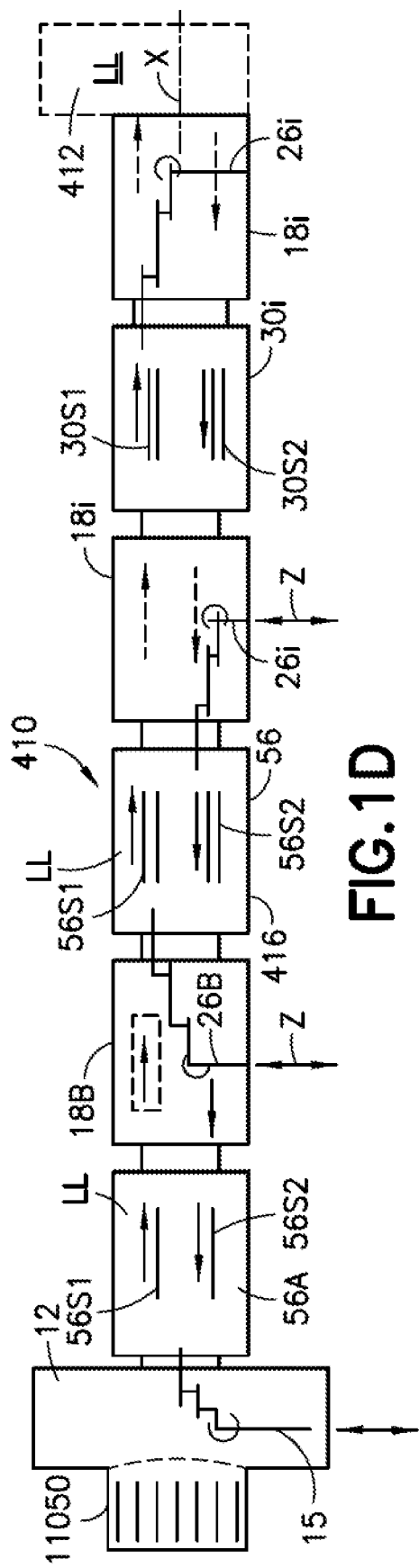

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18*i*. Each chamber module may be capable of holding an isolated or controlled atmosphere (e.g. N2, clean air, vacuum). As noted before, the configuration/arrangement of the transport chamber modules 18B, 18*i*, load lock modules 56A, 56 and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18*i*) may be configured to operate as a load lock.

Figure 2A:
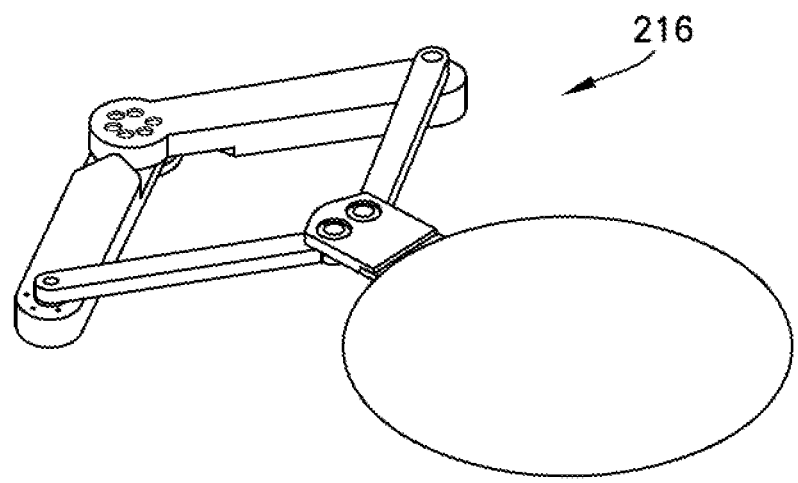
Figure 2B:
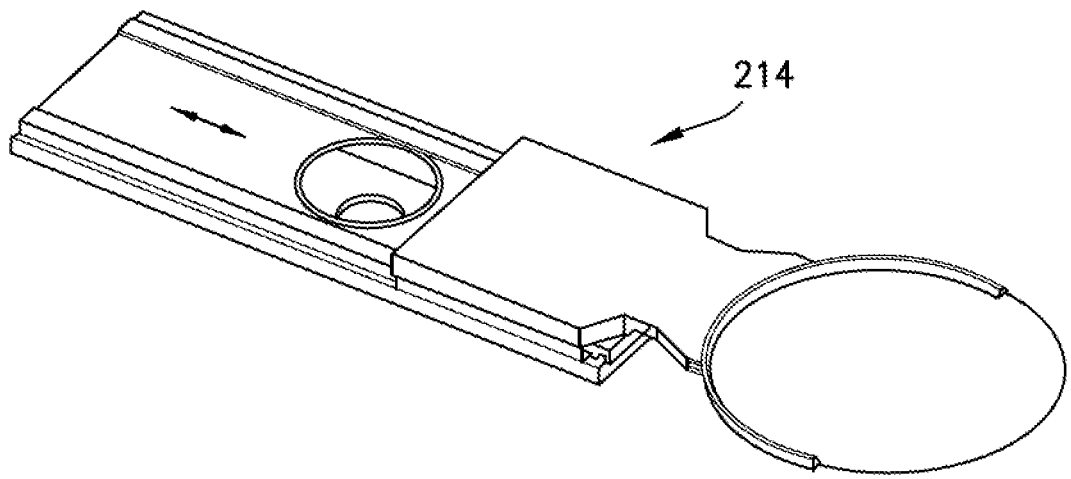
Figure 2C:
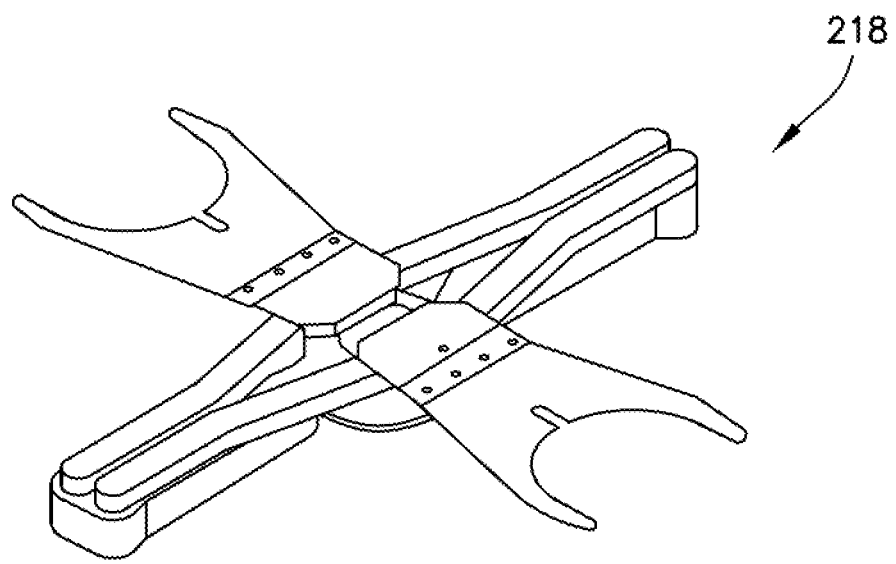
Figure 2D:
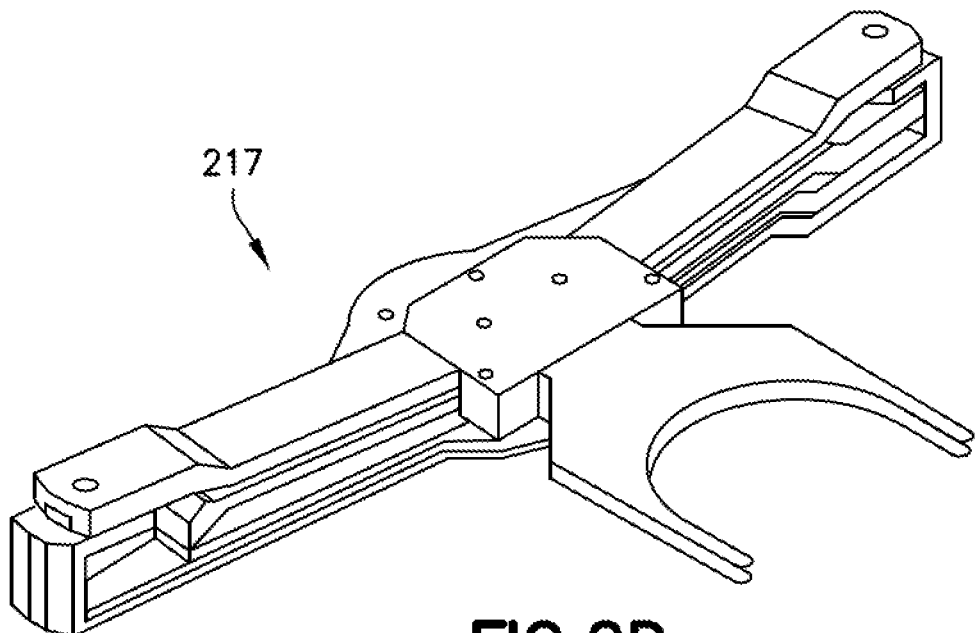

As also noted before, transport chamber modules 18B, 18*i* have one or more corresponding transport apparatus 26B, 26*i*, which may include one or more aspects of the disclosed embodiment described herein, located therein. The transport apparatus 26B, 26*i* of the respective transport chamber modules 18B, 18*i* may cooperate to provide the linearly distributed workpiece transport system in the transport chamber. In this aspect, the transport apparatus 26B (which may be substantially similar to the transport apparatus 11013, 11014 of the cluster tool illustrated in FIGS. 1A and 1B) may have a general SCARA arm configuration (though in other aspects the transport arms may have any other desired arrangement such as, for example, a linearly sliding arm 214 as shown in FIG. 2B or other suitable arms having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm may be derived from a conventional SCARA (selective compliant articulated robot arm) type design, which includes an upper arm, a band-driven forearm and a band-constrained end-effector, or from a telescoping arm or any other suitable arm design. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2A) configuration, a leap frog arm 217 (FIG. 2D) configuration, a bi-symmetric arm 218 (FIG. 2C) configuration, etc. In another aspect, referring to FIG. 2E, the transfer arm 219 includes at least a first and second articulated arm 219A, 219B where each arm 219A, 219B includes an end effector 219E configured to hold at least two substrates S1, S2 side by side in a common transfer plane (each substrate holding location of the end effector 219E shares a common drive for picking and placing the substrates S1, S2) where the spacing DX between the substrates S1, S2 corresponds to a fixed spacing between side by side substrate holding locations. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties.

In the aspect of the disclosed embodiment shown in FIG. 1D, the arms of the transport apparatus 26B may be arranged to provide what may be referred to as fast swap arrangement allowing the transport to quickly swap wafers (e.g. pick a wafer from a substrate holding location and then immediately place a wafer to the same substrate holding location) from a pick/place location. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about shoulder and elbow joints with Z axis motion). As seen in FIG. 1D, in this aspect the modules 56A, 56, 30i may be located interstitially between transfer chamber modules 18B, 18i and may define suitable processing modules, load lock(s) LL, buffer station(s), metrology station(s) or any other desired station(s). For example the interstitial modules, such as load locks 56A, 56 and workpiece station 30i, may each have stationary workpiece supports/shelves 56S1, 56S2, 30S1, 30S2 that may cooperate with the transport arms to effect transport or workpieces through the length of the transport chamber along linear axis X of the transport chamber. By way of example, workpiece (s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 3A:
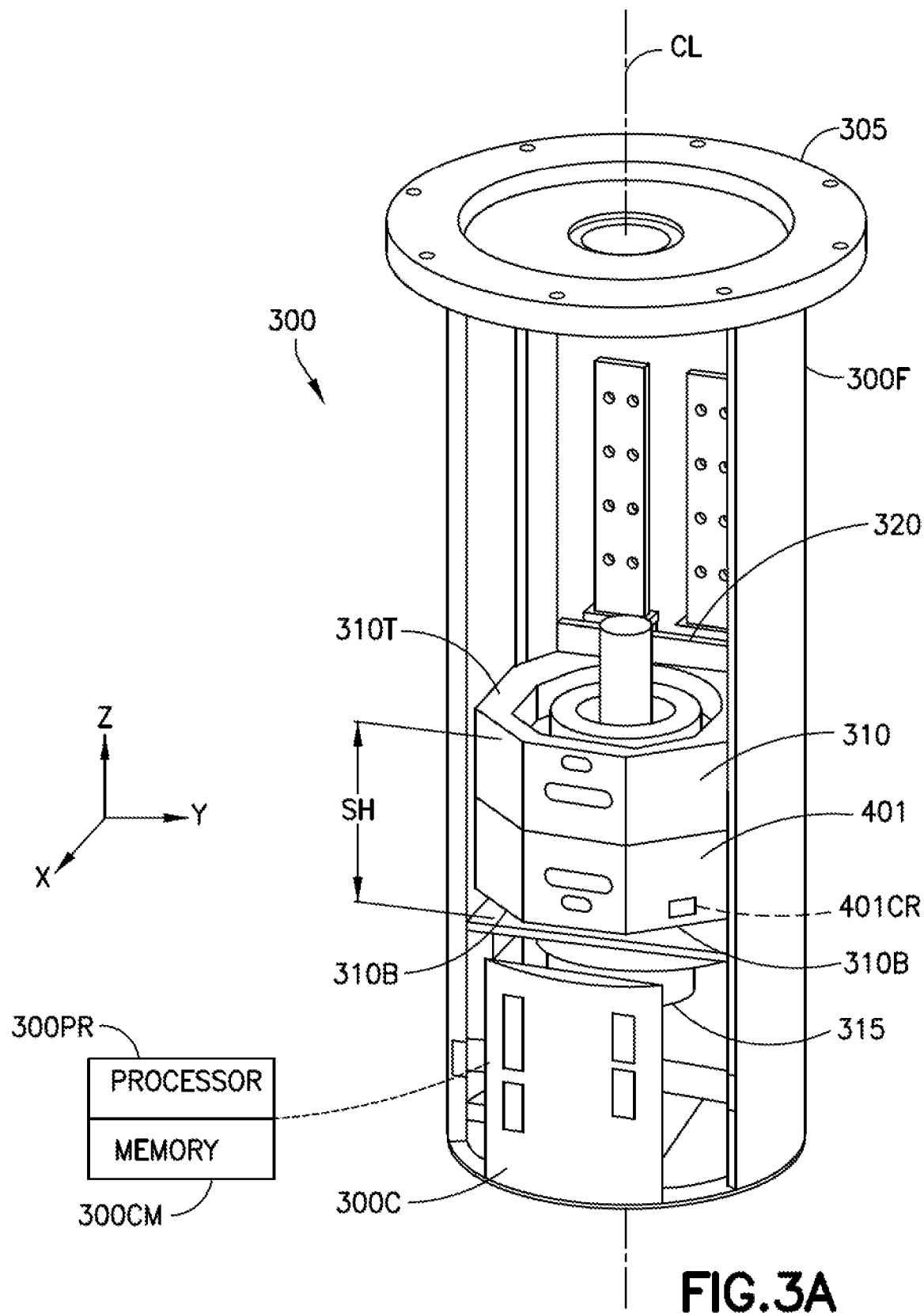
FIGS. 3A, 3B, 3C and 3D are schematic illustrations of portions of a substrate transport apparatus in accordance with aspects of the disclosed embodiment.
Figure 3B:
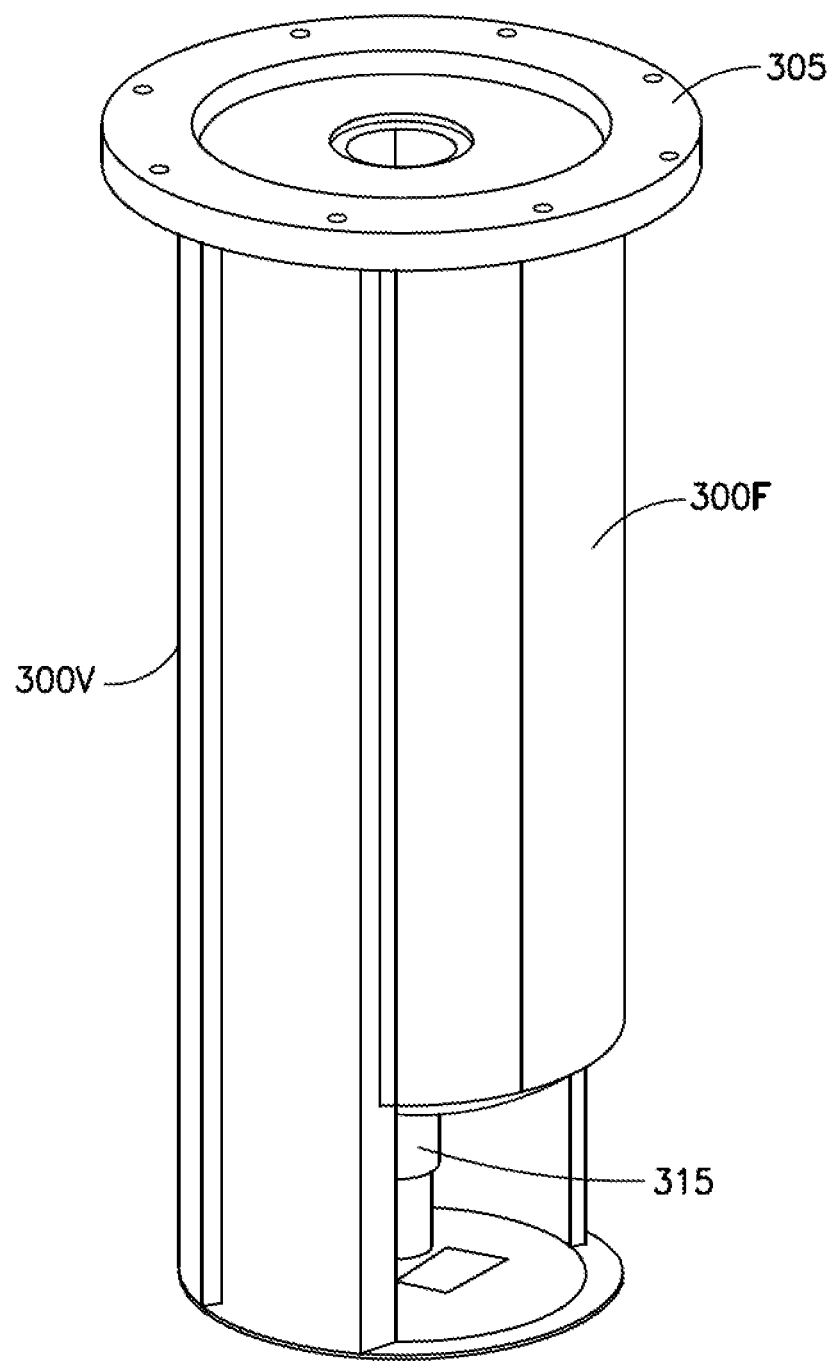
Figure 3C:
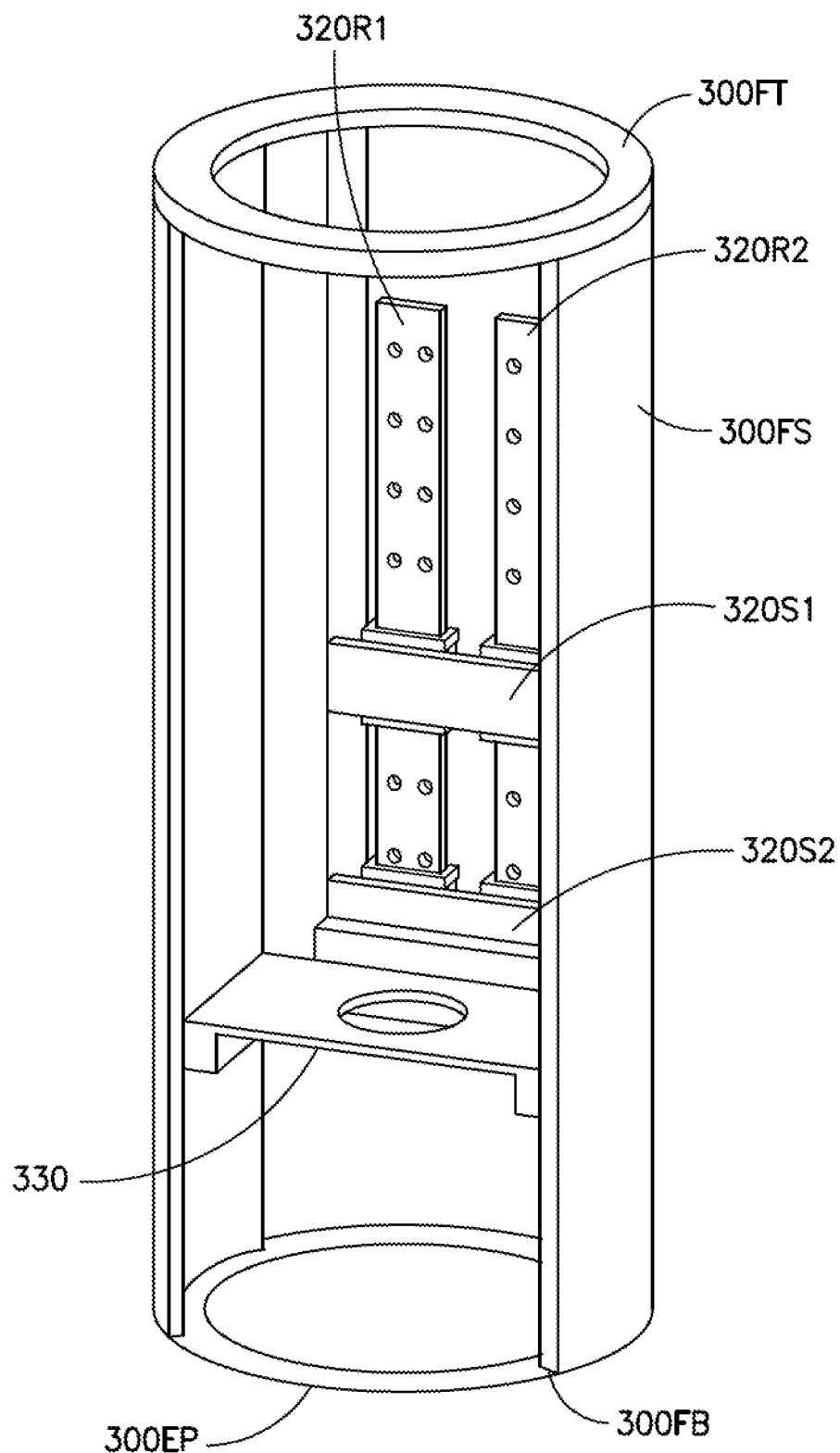

Referring now to FIGS. 3A, 3B and 3C, the transport apparatus described above includes a drive section or unit 300 connected to a frame F (FIG. 1C) of the transport apparatus. In one aspect, the drive section 300 includes a frame or support structure 300F that is connected to the frame F of the substrate transport apparatus in any suitable manner such as by, for example, a flange 305 which is coupled to one end (e.g. the top 300FT or the bottom 300FB) of the frame 300F. In other aspects, the frame 300F is a side mount frame having a side mounting arrangement for mounting to, for example, a substrate processing apparatus such as those described herein. The side mounts of the frame 300F may depend from a side 300FS of the frame and, in one aspect, define a kinematic coupling that enables the interchangeability of the frame 300F. In one aspect, the frame 300F is substantially similar to that described in U.S. Pat. No. 8,573,919 issued on Nov. 5, 2013, the disclosure of which is incorporated herein by reference in its entirety.

The frame 300F of the drive section 300 has any suitable shape and configuration such as, for example, a generally cylindrical or channel shape having a top 300FT, a bottom 300FB and at least one side 300FS. In one aspect, the frame 300F is of monocoque or semi-monocoque construction (i.e. the walls or shell formed by the frame 300F are load bearing and carry the loads imparted on the frame 330F). In one aspect the frame 300F is of a unitary construction (i.e. a one piece member). In one aspect the frame 300F is forged, cast, extruded or formed in any other suitable manner from any suitable metal, such as stainless steel or aluminum alloy. In other aspects, the frame 300F may be constructed of any suitable plastics, ceramics and/or composite materials. In one aspect, the bottom 300FB of the frame 300F includes an end plate 300EP that is coupled to the bottom FB in any suitable manner to, at least in part, define the interior space of the frame 300F. In one aspect the end plate 300EP provides a mounting platform for components, such as electronics package or controller 300C. The controller 300C is any suitable controller configured to control each individual motor module of motor stack 310. The controller 300C is in one aspect, connected to controller 11091 in any suitable manner and may communicate with controller 11091 to effect the operations of the substrate transport apparatus associated with drive section 300.

Figure 3D:
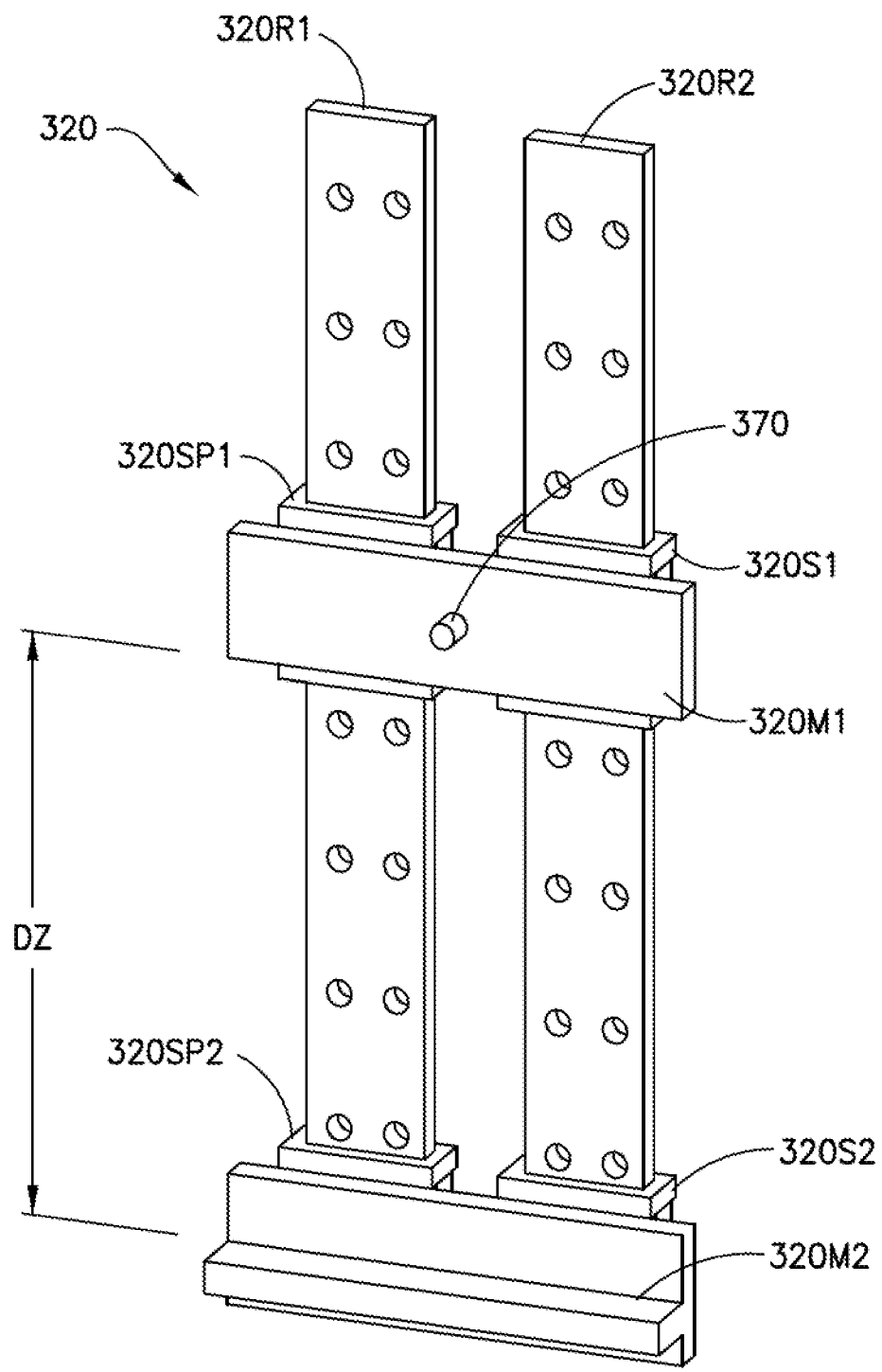

The motor stack 310 is movably mounted within the frame 300F in any suitable manner. For example, referring also to FIG. 3D, a movable carriage 320 having a variable length (i.e. Z height DZ) is mounted within the frame 300F and is configured to movably support the motor stack for movement (e.g. linearly sliding movement) of the motor stack 310 along the Z direction. In one aspect the movable carriage 320 provides the transport apparatus with a Z axis stroke ZS (FIGS. 8A-8C) of about 50 mm, about 100 mm, about 135 mm and/or about 150 mm using components common to all strokes. In other aspects, the movable carriage provides any suitable Z axis stroke greater than about 150 mm or less than about 50 mm and therebetween. As will be described herein the movable carriage enables flexibility of spindle assembly type and quantity while improving motor/spindle alignment. The carriage 320 includes one or more guide rails 320R1, 320R2, a first or upper slide member 320S1 and a second or lower slide member 320SS2 where the one or more guide rails 320R1, 320R2 are common to both of the first and second slide members 320S1, 320S2 and the first and second slide members 320S1, 320S2 are separated from one another. The one or more guide rails 320R1, 320R2 are coupled to the frame 300F in any suitable manner. In one aspect, the one or more guide rails 320R1, 320R2 are mechanically coupled to the frame 300F while in other aspects, the one or more guide rails 320R1, 320R2 are integrally formed with the frame 300F. For example, in one aspect, the one or more guide rails 320R1, 320R2 are integrally formed with the frame 300F as a unitary, one piece, member. The first and second slide members 320S1, 320S1 are movably mounted to the one or more guide rails 320R1, 320R2 so that each of the first and second slide members 320S1, 320S2 is freely movable along a length of the one or more guide rails 320R1, 320R2 independent of another one of the first and second slide members 320S1, 320S2 (each of the first and second slide members 320S1, 320S2 includes separate corresponding linear rail platens 320SP1, 320SP2). In one aspect, the independent movement of each of the first and second slide members 320S1, 320S2 provides for the variable Z height DZ of the carriage 320 as described herein such that the carriage 320 accounts for different spindle lengths depending on the number and configuration of the motor modules 401 included in the motor stack 310.

Figure 4A:
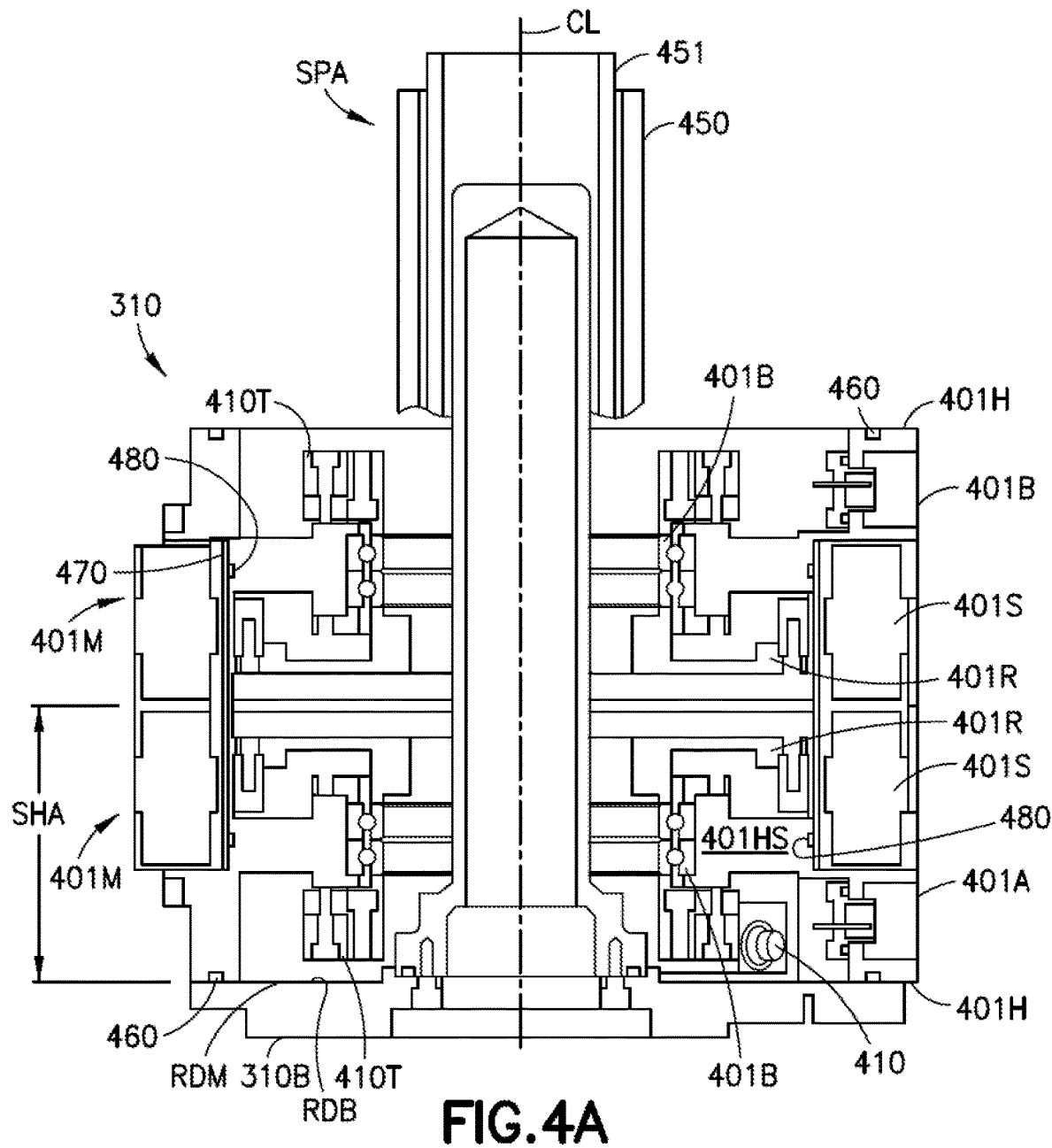
FIGS. 4A and 4B are schematic illustrations of portions of a substrate transport apparatus in accordance with aspects of the disclosed embodiment.
Figure 4B:
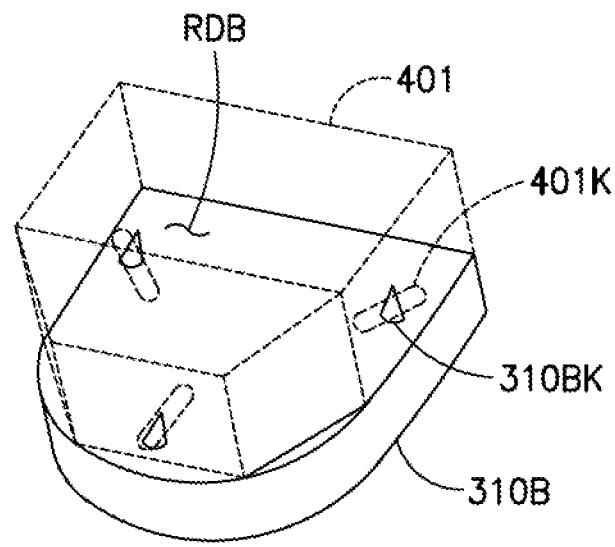
Figure 4C:
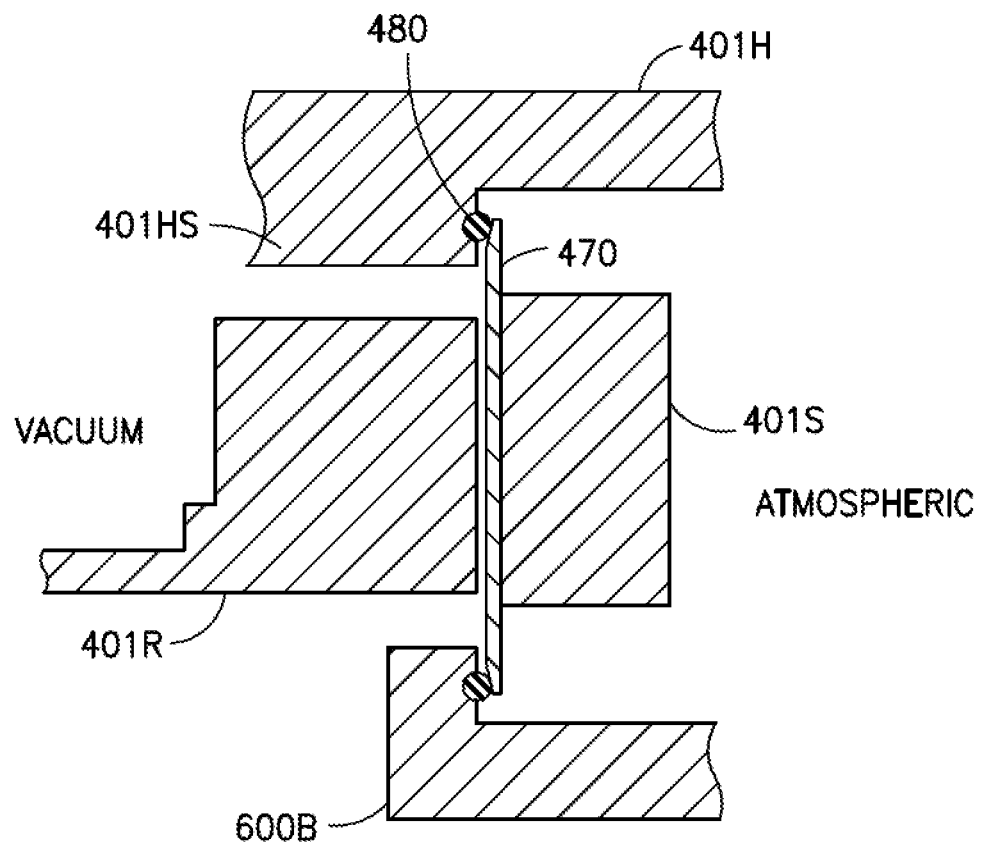
FIG. 4C is a schematic illustration of a portion of a substrate transport apparatus in accordance with aspects of the disclosed embodiment.
Figure 6:
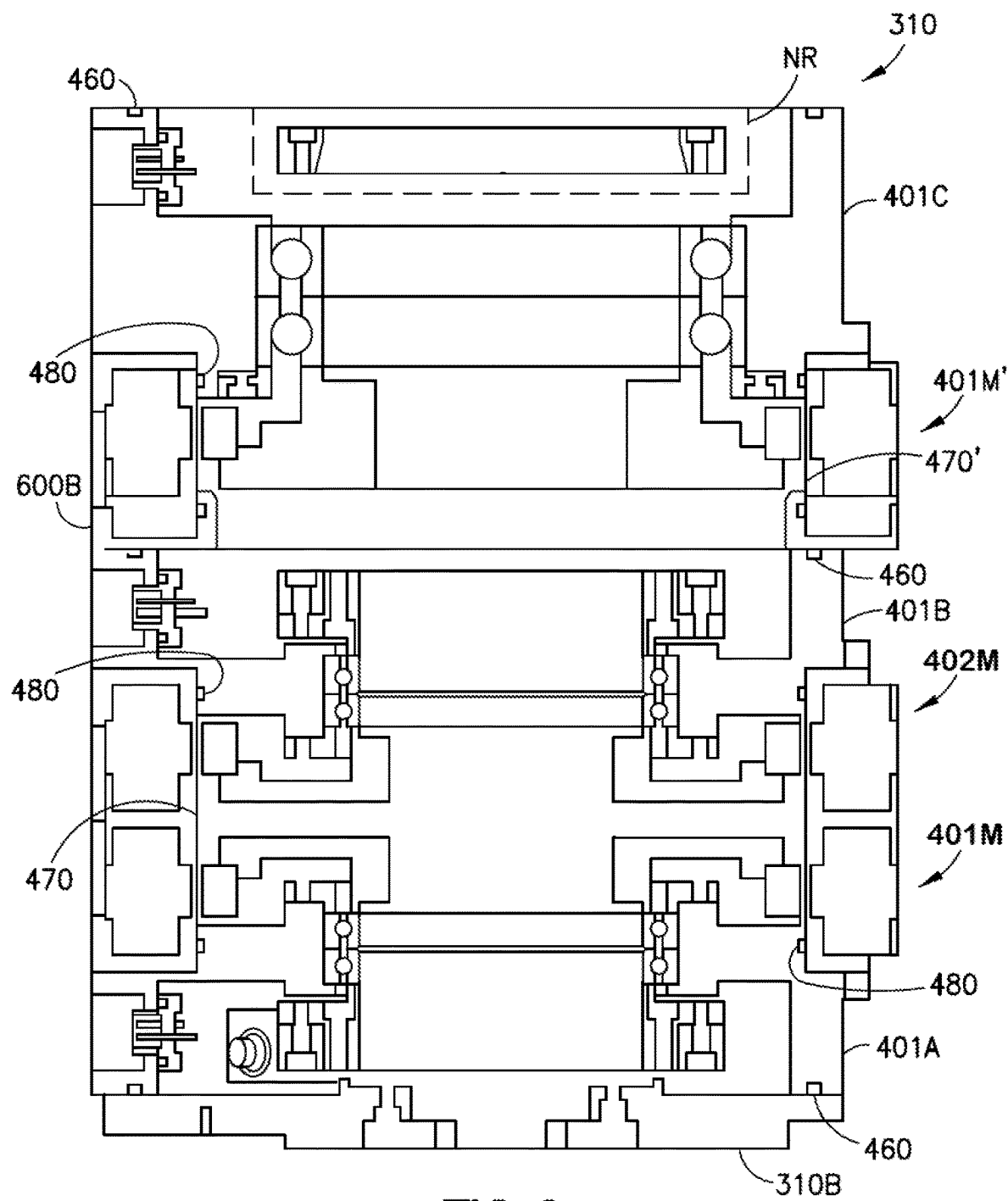
FIG. 6 is a schematic illustration of a portion of a substrate transport apparatus in accordance with aspects of the disclosed embodiment.

The first slide member 320S1 includes a motor mount 320M1 that is configured to couple to and spatially locate an upper most (i.e. top) motor module 401 in the motor stack 310. For example, the motor mount 320M1 includes any suitable locating feature(s) 370 that locate the top of the motor stack 310 in a predetermined position within the frame 300F and secure the top of the motor stack 310 from side to side movement. In one aspect, the locating feature 370 is a pin or slot configured to engage a corresponding pin or slot on the motor module 401 while in other aspects, the locating feature(s) 370 are mating grooves or any other retention feature. The second slide member 320S2 includes motor mount 320M2 to which at least a portion of the lowermost (i.e. bottom) motor module 401 is coupled. In one aspect, referring also to FIG. 4B) a motor stack base member 310B is coupled to and forms at least part of the motor mount 320M2. The motor stack base member 310B extends from and is cantilevered from the second slide member 320S2 for at least partially supporting the motor stack 310. In one aspect, the motor stack base member 310B includes kinematic locating features 310BK that interface and engage with corresponding kinematic mating features 401K of the bottom motor module 401 for positioning the bottom motor module in a predetermined location (e.g. a predetermined location in each of the X, Y and Z axes as well as in a predetermined rotational, i.e. θ, orientation) with respect to the centerline CL location of the spindle assembly SPA within the frame 300F. It should be understood that the spindle assembly SPA illustrated in FIG. 4A is shown as a coaxial spindle assembly having two drive shafts 450, 451 corresponding to two motor modules 401A, 401B however, in other aspects the coaxial spindle assembly SPA has any suitable number of drive shafts (such as more or less than two) corresponding to any suitable number of motor modules 401 disposed in the drive section 300. For example, FIG. 6 illustrates a three axis drive having three motor modules 401A, 401B, 401C which corresponds to a tri-axial spindle assembly having three drive shafts.

In one aspect, the motor stack base member 310B forms a reference datum RDB for the Z axis location of the motor stack 310 (and hence a transport arm coupled to the motor stack 310). In one aspect, a Z axis drive module 315 of the drive section 300 is coupled to the motor stack base member 310B in any suitable manner for effecting the displacement of the motor stack base member 310B, the first and second slide members 320S1, 320S2 and the motor stack 310 coupled thereto along the one or more rails 320R1, 320R2 in the Z direction as a unit. In one aspect the variable length carriage 320 is employed so that a common coupling between the carriage 320 and the motor stack 310 ensures space to accommodate, free from interference, variable motor stack heights and the Z drive, as described herein, where the Z-axis location reference datum formed by the motor stack base member 310B interfaces with a corresponding datum surface on the bottom motor module 401 as the location of the top of the motor stack 310 varies with the different motor stack 310 heights DZ1, DZ2, DZ3 (see FIGS. 8A-8C).

A fixed platform 330 is disposed within the frame 330F and is connected to the frame 330F in any suitable manner. The fixed platform 330 is configured to support any suitable Z axis drive module 315 (e.g. the Z-axis drive module is mounted to the fixed platform 330 in any suitable manner). The Z axis drive module is operably coupled to one or more of the carriage slide members 320S1, 320S2 and the motor stack base member 310B for moving motor stack 310 along the Z axis. In one aspect, the Z axis drive module is, in one aspect, a ball screw drive or any other suitable linear actuator.

Referring to FIG. 4A motor module 401A includes a housing 401H that has a motor module height SHA. The components of the motor module, as described herein, are disposed within the housing 401H and are bound by the motor module height SHA. In one aspect, the motor module 401A includes a motor 401M that defines a single or common axis of the drive section 300. The motor includes a stator 401S and a corresponding rotor 401R. The stator 401S is fixed at least partly within the housing 401H. The rotor 401R is movably mounted within the housing 401H in any suitable manner. For example, in one aspect, at least one mechanical bearing 401B is disposed within the housing such that an outer race of the at least one mechanical bearing is secured to the housing for fixing the at least one mechanical bearing 401B within the housing 401H. The inner race of the at least one mechanical bearing 401B is coupled to the rotor 401R for movably supporting the rotor 401R within the housing 401H so that the rotor 401R operably interfaces with the stator 401S. Unlike in conventional drive motors, the bearing/rotor support 401HS of the housing 401H is arranged to position the at least one mechanical bearing 401B so that the at least one mechanical bearing 401B is at least partially nested within the stator 401S to form a motor module having a compact motor module height, that is independent of the mechanical drive shaft bearings 401B, 401B' (see FIGS. 4A and 5), when compared to a conventional motor. For example, as can be seen in FIG. 4A, the compact motor module height is effected such that the rotor 401R is shaped to have a channel cross section so that the bearing/rotor support 401HS is at least partially disposed with in the channel of the rotor 401R. In one aspect, the motor housing 401H includes one or more recesses or notches NR (FIG. 6) that allows one or more of the carriage slides 320S1, 320S2 to fall within the radius of the motor 401M such that the motor housing 401H and the carriage slides 320S1, 320S2 fall clear the rails 20R1, 320R2 and the diameter/radius of the drive section is reduced. When compared to the structure of a conventional motor (in which the rotor and bearing support are substantially inline and stacked one over the other such that the bearings are located above the stator), the aspects of the disclosed embodiment provide for a much more compact motor having a reduced module height SHA when compared to the conventional motor. The aspects of the disclosed embodiments described herein also provide for a self-contained motor module 401 where the motor, such as motor 401M, of the motor module 401, the bearings such as bearing 401B, the rotor, such as rotor 401R and encoder 410 are a self-contained modular unit independent of the respective drive shaft of the spindle assembly SPA. For example, the respective drive shaft of the spindle assembly SPA is, in one aspect, installed in the respective motor module 401 after motor module assembly in any suitable manner. For example, the respective drive shaft is installed in the self-contained motor module 401 by pressing the respective drive shaft into the inner race of the bearing 401B.

Figure 7:
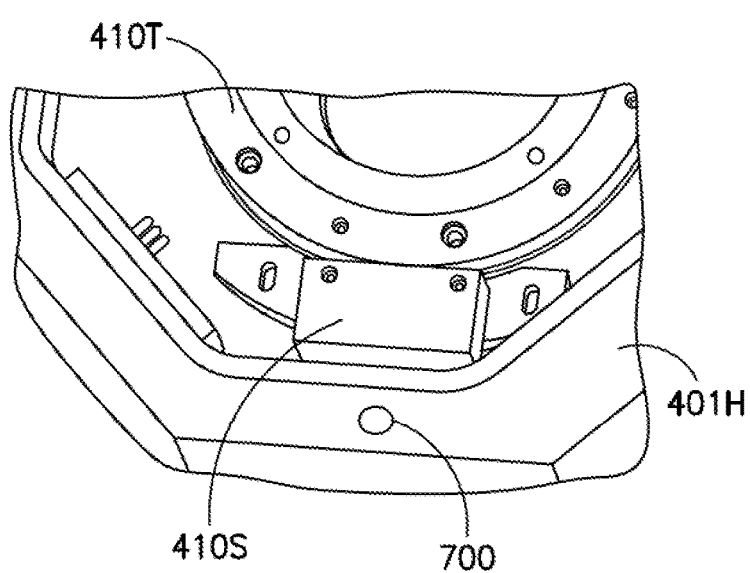
FIG. 7 is a schematic illustration of a portion of a substrate transport apparatus in accordance with aspects of the disclosed embodiment.

In one aspect, the motor module 401A includes any suitable encoder 410 that is in communication with, for example, controller 300C to effect the indication of a rotational θ position of the motor 401M (and hence the position of of at least a corresponding portion of the transfer arm coupled to the drive section 300). In one aspect, referring also to FIG. 7, the encoder 410 includes any suitable sensor 410S and at least one encoder track 410T. The sensor 410S is mounted to the housing 401H in any suitable manner so that the sensor 410S is positioned to read the at least one encoder track 410T. The encoder track 410T, in one aspect, includes one or more of an absolute scale and an incremental scale.

Still referring to FIG. 4A, as described above, the motor modules 401 are modular units that can be stacked in the motor stack 310 to form a drive section 300 having any suitable number of drive axes. As an example, FIG. 4A illustrates a motor stack having two motor modules 401A, 401B forming a two axis drive section 300. The housing 401H of each motor module 401A, 40B includes any suitable location features 700 (FIG. 7) configured to spatially locate one motor module 401A, 401B relative to another one of the motor modules 401A, 401B in the motor stack 310. For example, the housing 401H of one motor module 401A, 401B includes at least one pin and at least one a recess that engage a corresponding pin and recess on another housing 401H of another motor module 401A, 401B for orienting the motor modules 401A, 401B in the X, Y and θ directions relative to each other and the centerline CL of the spindle assembly SPA within the frame 300F, noting that the bottom motor module, which in this example is motor module 401A, forms the reference datum of the motor stack 310 through its interface with the motor stack base member 310B. In other aspects, the housing(s) 401H have any suitable locating features for positioning one housing 401H relative to another housing 401H in the motor stack 310.

The motor modules 401A, 401B are arranged in the motor stack 310 so that the stators 401S of each motor module 401A, 401B are adjacent one another so that a non-magnetic can seal or isolation wall 470 spans between the respective housings 401H to form a common seal that hermetically isolates the respective stators 401S from an environment within which the respective rotors 401R operate. In one aspect, the can seal 470 comprises a seal that is shaped like a can or otherwise has a cylindrical configuration. The can seal 470 is, in one aspect, substantially similar to that described in U.S. patent application Ser. No. 14/540,072 filed on Nov. 13, 2014 and entitled "Sealed Robot Drive", the disclosure of which is incorporated herein by reference in its entirety. In one aspect, the can seal 470 is integrated into the housing 401H of the motor module 401 (e.g. the stator housing) however, in another aspect the can seal 470 (see FIG. 4D) may be integrally formed or otherwise integrated with the stator (e.g. separate from the drive housing) so that the stator structurally supports the can seal 470. In one aspect, the can seal 470 provides for the selection of interchangeable modules in that the seal is inserted between the motor modules 401A, 401B during stacking of the motor modules 401A, 401B in the motor stack 310. In one aspect, the can seal 470 seals to the housing 401H with one or more seals 480 disposed between the can seal 470 and the housing 401H.

The motor module 401B is substantially similar to motor module 401A. In the aspect illustrated in FIG. 4A the motor module 401B is illustrated as being inverted relative to motor module 401A so that the stators 401S of each motor module 401A, 401B are disposed adjacent one another. In other aspects, the motor modules 401A, 401B have the same orientation so that the stators are disposed towards a top 310T of the motor stack 310 or a bottom 310B of the motor stack 310. It should be understood that the terms top and bottom as used herein refer to the drive section 300 and motor stack 310 being oriented so that the centerline CL is vertically arranged however, in aspects where the centerline CL is horizontally arranged terms other than top and bottom may be used to describe the terminal ends of the motors stack 310 and drive section 300. As will be described herein, where the stator 401S of one motor module 401 is not located adjacent the stator 401S of another motor module 401 a cap or intermediate base 600B is attached to the motor module 401 to provide an interface for the can seal 470 and so provide a sealing surface between the stacked motor modules 401. In one aspect, any suitable seal 460 is disposed at the top and bottom of each motor module 401 to form a seal between the motor modules and to form a seal between the bottom motor module 401A and the motor stack base member 310B, so that in conjunction with the can seal 470 the moving parts of the motor stack 310 are disposed in a sealed atmosphere.

Figure 5:
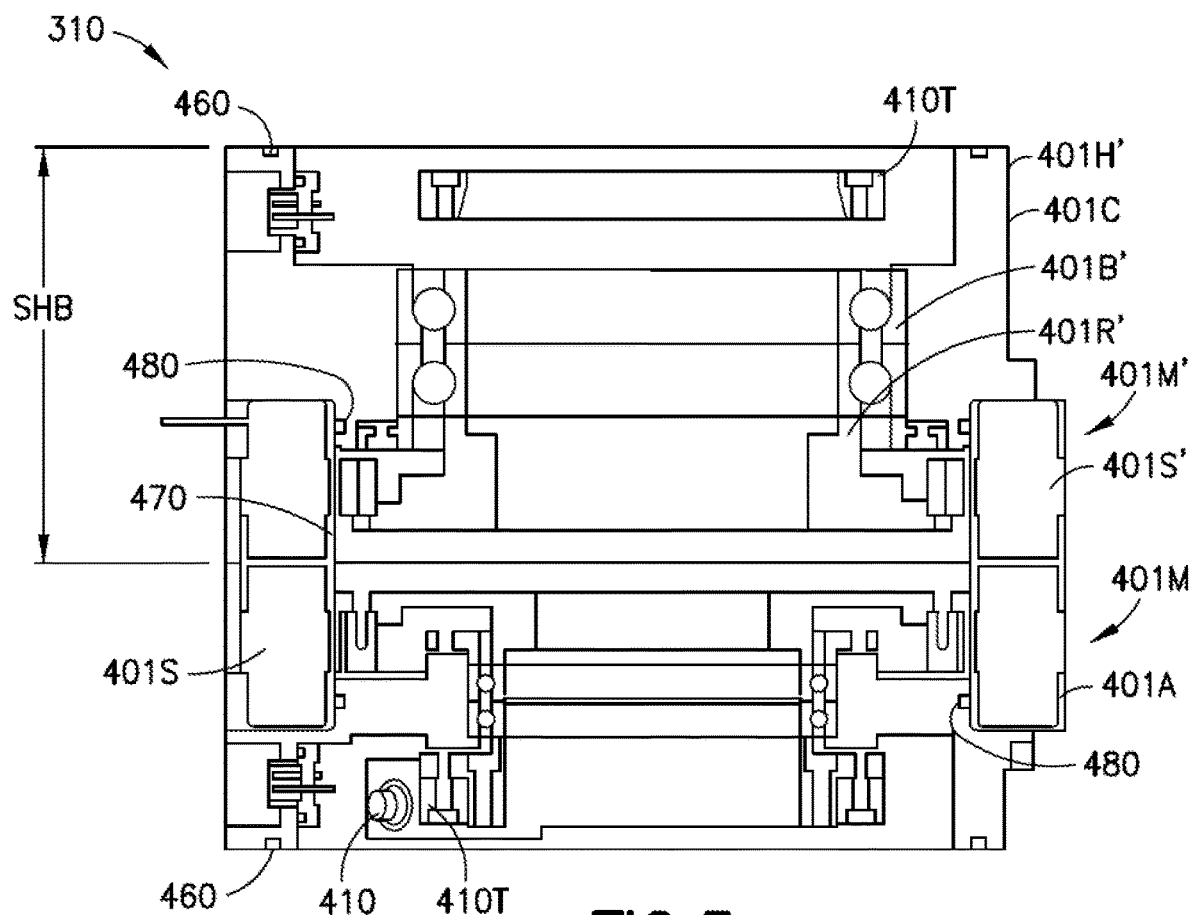
FIG. 5 is a schematic illustration of a portion of a substrate transport apparatus in accordance with aspects of the disclosed embodiment.

Referring now to FIG. 5, in one aspect, the motor modules 401 are configured to provide different respective drive characteristics such as different amounts of torque. In the aspect illustrated in FIG. 5 a two axis motor stack 310 is illustrated having the motor module 401A, which is a low torque motor module, and the motor module 401C (which is substantially similar to motor module 401A but for its torque output) is a high torque motor module that outputs a higher/greater torque than the low torque motor module 401A. The motor module 401C housing 401H' has a module height SHB that is greater than the module height SHA (FIG. 4A) of the motor module 401A due to, for example, the increased torque configuration of motor module 401C. In this aspect, the motor module 401C includes a motor 401M' having a stator 401S' and a rotor 401R'. The rotor 401R' is coupled to the inner race of bearing(s) 401B' to which a drive shaft of the spindle assembly SPA is coupled. The motor module 401C includes an encoder 410 as described above (the encoder track 410T is illustrated in FIG. 5). It is noted that the encoder track 410R of motor module 401C is located, in one aspect on the drive shaft while in other aspects the encoder track 410T is coupled to the inner race of bearing(s) 401B' in the manner described above. As can be seen in FIG. 5, the stators 401S, 401S' of the high and low torque motor modules 401C, 401A are disposed adjacent one another so that the can seal 470 spans between and is common to both the high and low torque motor modules 401C, 401A. It is noted that while the low torque motor module 401 is illustrated as being the bottom motor module in the motor stack 310 (e.g. forming the reference datum for the motor stack) in other aspects the high torque motor module 401C is located on the bottom of the motor stack so as to form the reference datum of the motor stack 310. In other aspects, to achieve greater torques any suitable number of motor modules 401A, 401B, 401C are combined such that the combined motors modules share a common drive shaft and the torques generated by the combined motors modules are commonly applied to the common drive shaft. For example, motor modules 401A, 401B may share a common drive shaft so that the output of the combined motor modules is twice that of each motor module 401A, 401B alone. As may be realized, the combined motor modules may be any suitable combination of high and/or low torque motor modules.

Referring to FIG. 6, a three axis motor stack having two low torque motor modules 401A, 401B are arranged as described above with respect to FIG. 4A and a high torque motor module 401C. In this aspect, the stators 401S of motor modules 401A, 401B are disposed adjacent one another to share a common can seal 470. Because of the odd number of motor modules there is no stator to which the stator 401S' of motor 401M' can be paired. As such, the intermediate base 600B is coupled to one end of motor module 401C to form an interface for the can seal 470' (which is substantially similar to can seal 470 however, can seal 470' has a length corresponding to a single stator rather than multiple stators) as well as an interface to another motor module 401B in the motor stack 310. It should be understood that the motor modules 401A, 401B, 401C may be arranged in any order within the motor stack 310 depending on for example a predetermined torque output of each drive shaft in the spindle assembly SPA where the bottom drive module corresponds to, for exemplary purposes only, the innermost drive shaft and the top motor module corresponds to the outermost drive shaft.

Figure 8A:
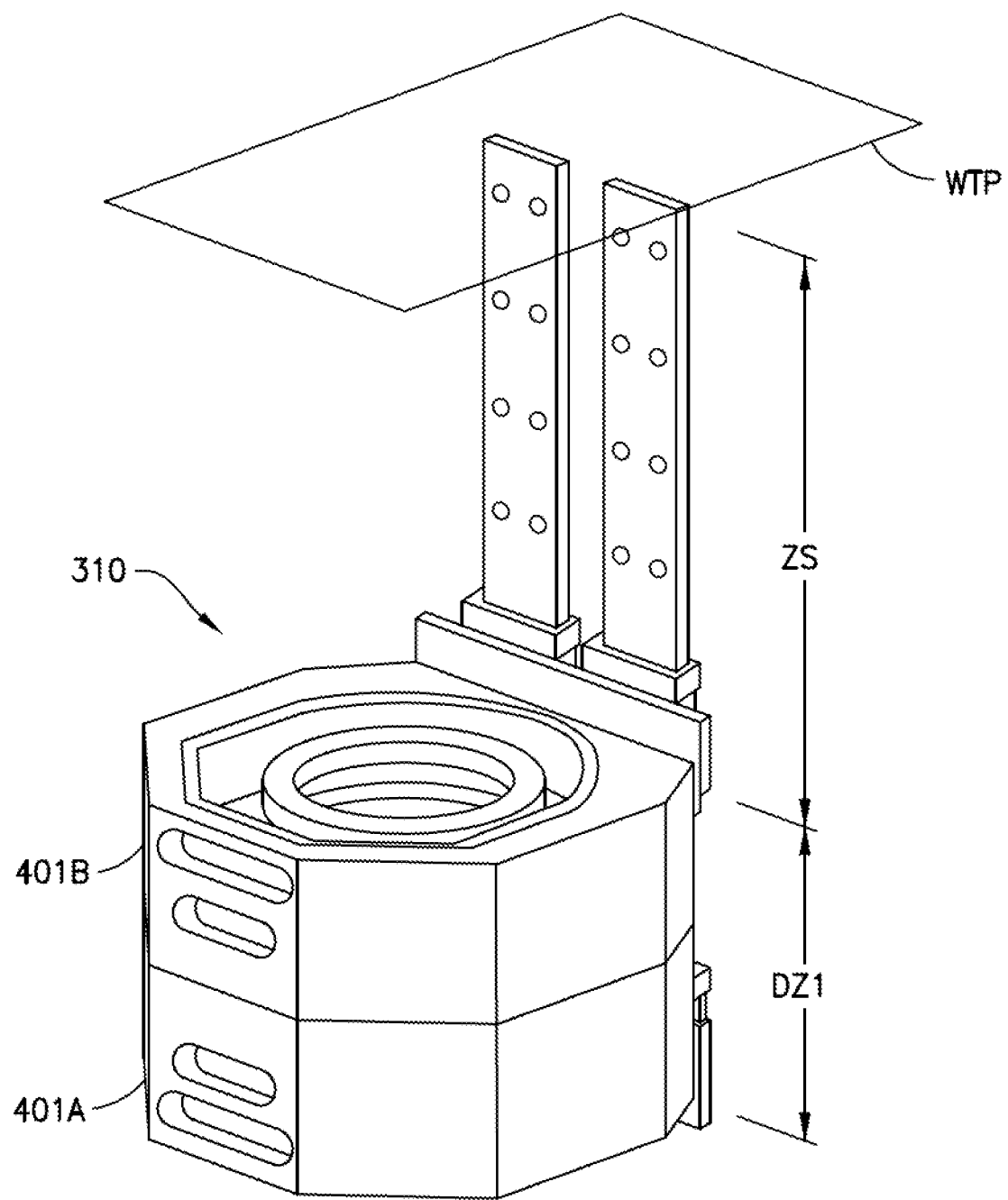
FIGS. 8A, 8B and 8C are schematic illustrations showing different configurations of a portion of a substrate transport apparatus in accordance with aspects of the disclosed embodiment.
Figure 8B:
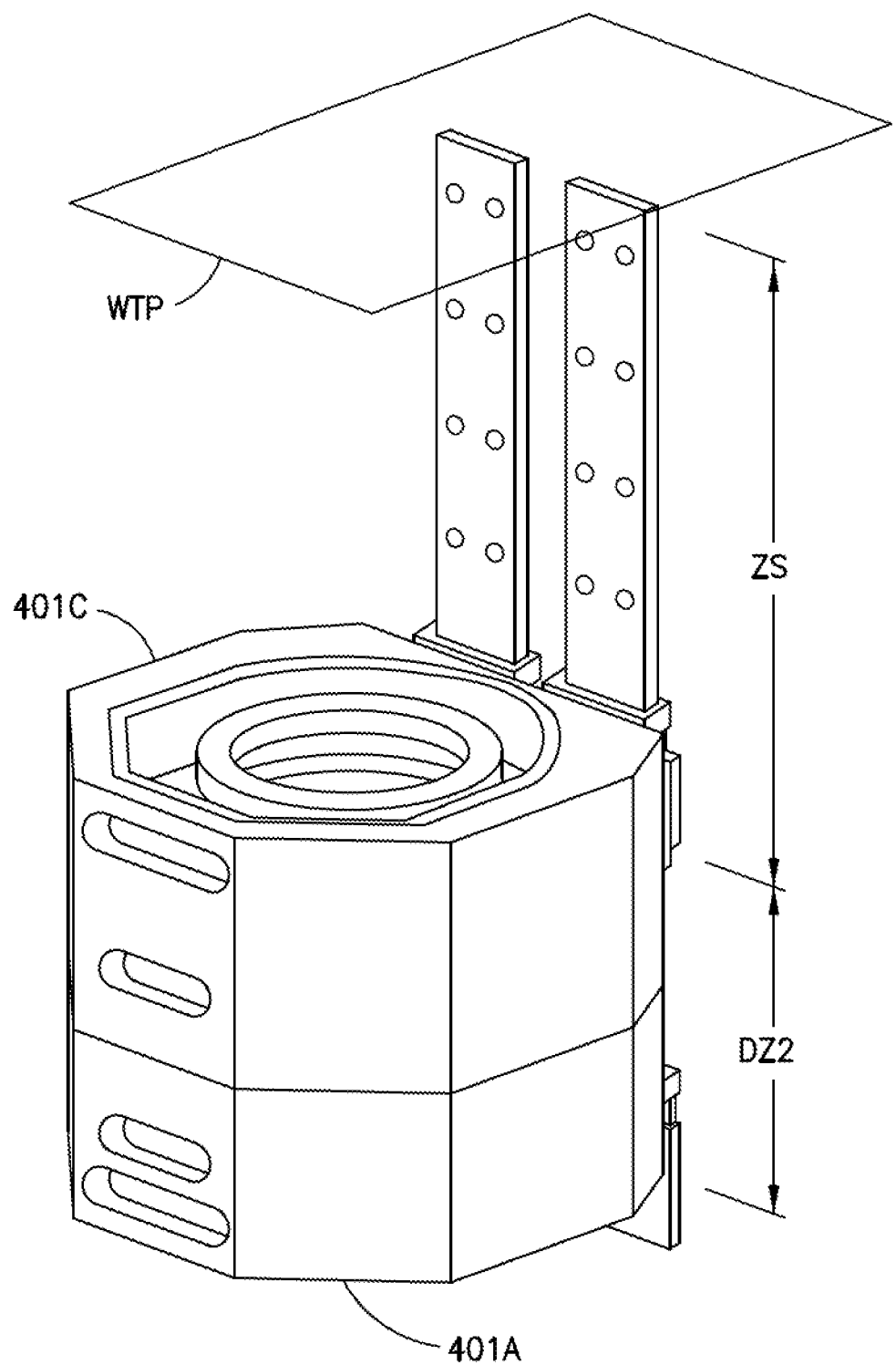
Figure 8C:
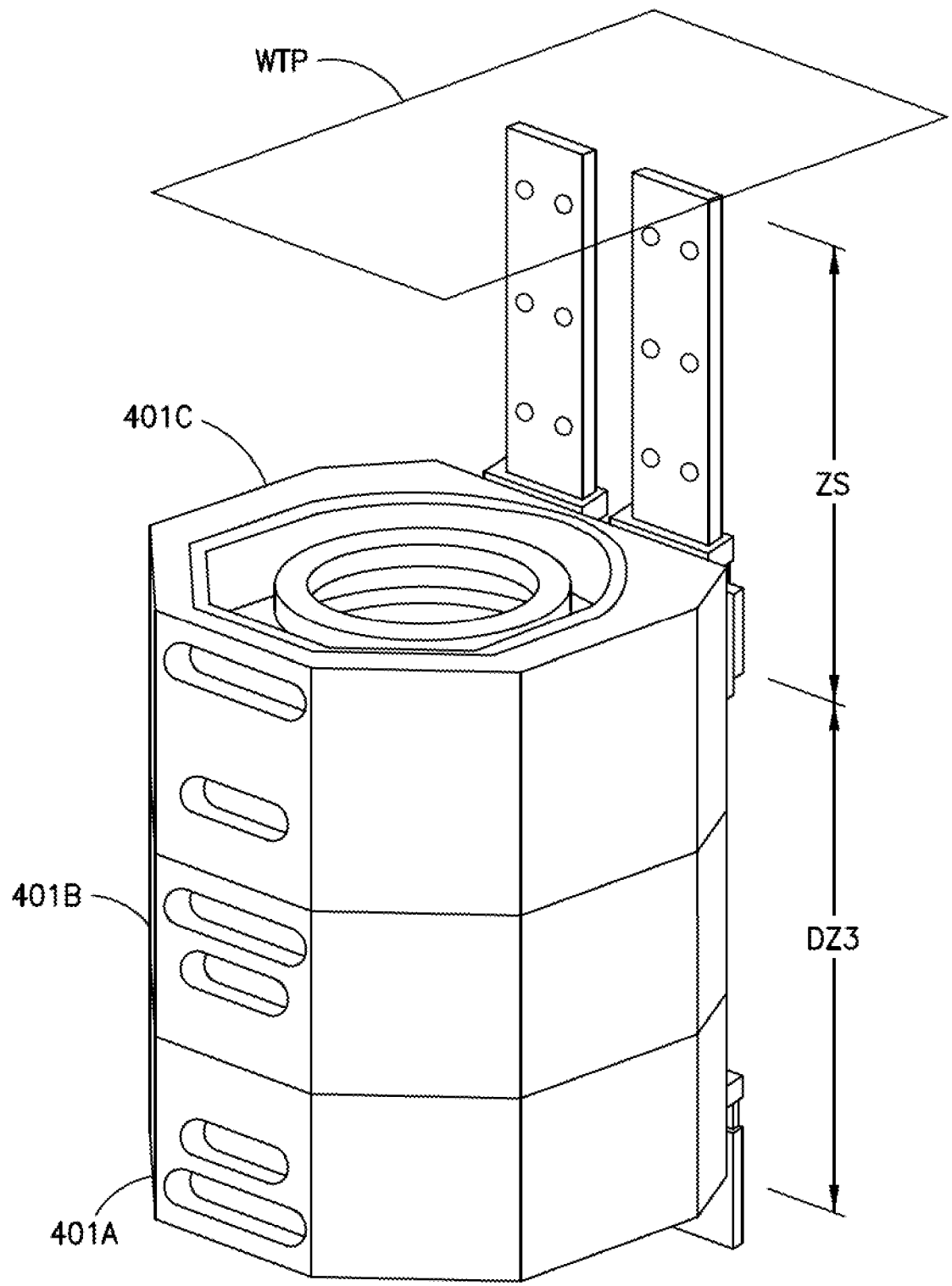

Referring now to FIGS. 8A, 8B and 8C, as described above, the distance of the carriage slide 320S1 from the carriage slide 320S2 depends on a height of the motor stack 310 such that the motor stack shell (i.e. the combined motor modules housings 401H, 401H' form the motor stack shell) forms at least part of the carriage 320 (e.g. the motor stack joins carriage slides 320S1, 320S2 to each other) and the motor stack height SH sets the carriage 320 length. For example, FIG. 8A illustrates a motor stack 310 having motor modules 401A, 401B each having a module height SHA so that the carriage has a length DZ1 substantially equal to twice the module height SHA. FIG. 8B illustrates a motor stack 310 having motor modules 401A, 401C where motor module 401A has module height SHA and motor module 401C has module height SHB so that the carriage has a length DZ2 substantially equal to module height SHA plus module height SHB. FIG. 8C illustrates a motor stack 310 having motor modules 401A, 401B and 401C where motor modules 401A, 401B each have module height SHA and motor module 401C has module height SHB so that the carriage has a length DZ2 substantially equal to two times module height SHA plus module height SHB. As may be realized, the carriage 320 may have any other suitable length depending on the number and type (e.g. high or low torque) of motor modules 401 placed in the motor stack 310. Each of the configurations illustrated in FIGS. 8A-8C, and the aspects of the disclosed embodiment generally, provide for respective Z strokes ZS as described herein with respect to a wafer transfer plane WTP. The height of the wafer the wafer transfer plane WTP from, for example, a floor of the fabrication facility is defined by the Semiconductor Equipment and Materials International standards. As described above, the motor modules 401 described herein have a compact motor module height that allows for an increased number of motor modules and/or increased capacity motor modules (e.g. higher torque motor modules such as motor module 401C) to be installed relative to the given height wafer transfer plane from, for example the fabrication facility floor when compared to conventional substrate transport motor/motor modules while still allowing for the Z strokes ZS described herein.

Figure 9:
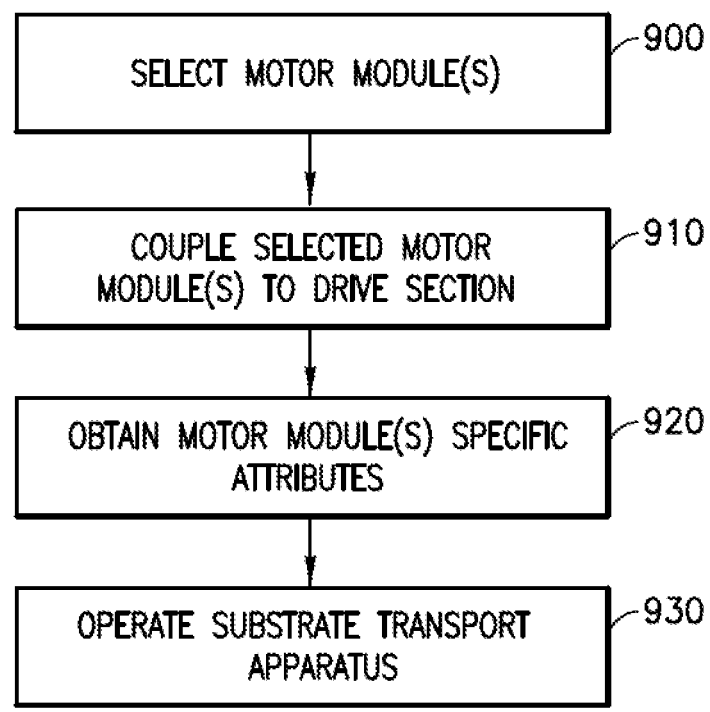
FIG. 9 is a flow diagram in accordance with aspects of the disclosed embodiment.

Referring now to FIGS. 4A and 9 an exemplary operation of the aspects of the disclosed embodiment will be described. In one aspect, at least one motor module 401 is selected from a number of different motor modules 401A, 401B, 401C (FIG. 9, Block 900). The selected motor module(s) is/are coupled to the drive section 300 and at least controller 300C (FIG. 9, Block 910). For example, the motor module(s) 401 are mounted to or otherwise coupled to the carriage 320 as described above. The motor module specific attributes for each of the selected motor module(s) 401 are obtained from the respective memory 401CR by for example, controller 300C and/or controller 11091 (FIG. 9, Block 920). The controller 300C and/or controller 11091 operates the substrate transport apparatus, such as those described herein, by generating commanded trajectory motion parameters for the respective motor module(s) 401 to achieve a desired torque, position and time requirement(s) based on the selected motor module(s) 401 specific attributes without further tuning of the motor module after the motor module is installed in the drive section 300 (e.g. without in situ tuning of the motor module in the drive section) (FIG. 9, Block 930).

In accordance with one or more aspects of the disclosed embodiment:

A substrate transport apparatus comprising:
a frame; and
a drive section connected to the frame, the drive section including;
a multi-drive shaft spindle, with at least one coaxial shaft spindle;
more than one different interchangeable motor module arranged in a stack, each having a motor operably coupled to a corresponding shaft of the coaxial shaft spindle and defining a corresponding independent drive axis of the drive section, the motor of each module respectively having a motor stator, fixed to the frame, and a motor rotor joined to the corresponding shaft; and a can seal disposed between the motor stator and motor rotor of each motor module and hermetically sealing the respective motor stator and motor rotor from each other;

wherein at least one of the different interchangeable motor modules in the stack is selectable for placement in the stack from other different interchangeable motor modules capable of placement in the stack, each having a different predetermined characteristic, independent of placement in the stack, the different predetermined characteristic of the module defining a different predetermined drive characteristic of the corresponding drive axis, independent of shaft spindle location, so that selection of the at least one motor module determines the different predetermined drive characteristic of the corresponding axis different from another of the independent drive axis.

The substrate transport apparatus of the above, wherein the can seal spans across an interface between different interchangeable modules of the drive section.

The substrate transport apparatus of one or more of the above, wherein the stack height is variable where selection of the at least one module changes a height of the stack.

The substrate transport apparatus of one or more of the above, wherein the coaxial shaft spindle comprises a tri-axial spindle.

The substrate processing apparatus of one or more of the above, wherein at least one of the motor modules has shaft spindle mechanical bearings that are nested within the respective stator.

The substrate processing apparatus of one or more of the above, wherein at least one motor module is a compact height module where a module height of the compact height module is independent of the shaft spindle mechanical bearings.

The substrate processing apparatus of one or more of the above, wherein the drive section further includes a z carriage having connection to a top motor module and a bottom motor module of the stack.

The substrate processing apparatus of one or more of the above, wherein the motor modules are coupled to each other to form the stack and the coupled motor modules of the stack define the z carriage.

A substrate transport apparatus comprising:
a frame; and
a drive section connected to the frame, the drive section including;
a drive shaft spindle with at least one drive shaft;
more than one interchangeable motor module arranged in a stack, each having a motor operably coupled to a corresponding drive shaft of the drive shaft spindle and defining a corresponding independent drive axis of the drive section, the motor of each module respectively having a motor stator, fixed to the frame, and a motor rotor joined to the corresponding shaft;
wherein at least one of the interchangeable motor modules in the stack is selectable for placement in the stack from other interchangeable motor modules capable of placement in the stack; and
a linearly sliding carriage having a predetermined common coupling to the motor modules in the stack, the linearly sliding carriage having an adjustable length to effect coupling of the linearly sliding carriage to different stacks having respective stack heights with the predetermined common coupling.

The substrate transport apparatus of one or more of the above, wherein the predetermined common coupling of the linearly sliding carriage has a coupling portion that engages a bottom motor module in the stack and defines a Z axis reference datum fixing the stack Z height position.

The substrate transport apparatus of one or more of the above, wherein the predetermined common coupling of the linearly sliding carriage has another coupling portion that engages a top motor module in the stack and is configured so that a length between the coupling portion and the other coupling portion is a variable length.

The substrate transport apparatus of one or more of the above, wherein the length between the coupling portion and the other coupling portion is set by a height of the stack.

The substrate transport apparatus of one or more of the above, wherein the coupling portion and the other coupling portion have separate corresponding linear rail platens.

The substrate transport apparatus of one or more of the above, wherein the more than one interchangeable motor module arranged in the stack comprises two motor modules and the at least one drive shaft comprises two drive shafts, each drive shaft corresponding to a respective one of the two motor modules.

The substrate transport apparatus of one or more of the above, wherein the more than one interchangeable motor module arranged in the stack comprises three motor modules and the at least one drive shaft comprises three drive shafts, each drive shaft corresponding to a respective one of the three motor modules.

The substrate transport apparatus of one or more of the above, further comprising a can seal disposed between the motor stator and motor rotor of each motor module and hermetically sealing the respective motor stator and motor rotor from each other.

The substrate transport apparatus of one or more of the above, wherein each motor module in the stack has a different predetermined characteristic, independent of placement in the stack, the different predetermined characteristic of the module defining a different predetermined drive characteristic of the corresponding drive axis, independent of shaft spindle location, so that selection of the at least one motor module determines the different predetermined drive characteristic of the corresponding axis different from another of the independent drive axis.

The substrate transport apparatus of one or more of the above, wherein selection of the motor modules defines a height of the linearly sliding carriage.

A substrate transport apparatus comprising:
a frame; and
a drive section connected to the frame, the drive section including;
a drive shaft spindle with at least one drive shaft;
more than one different interchangeable motor module arranged in a stack, each having a motor operably coupled to a corresponding drive shaft of the drive shaft spindle and defining a corresponding independent drive axis of the drive section, the motor of each module respectively having a motor stator, fixed to the frame, a motor rotor joined to the corresponding shaft, and shaft spindle mechanical bearings fixed to the frame where at least a portion of the shaft spindle mechanical bearings are nested within the stator; and
wherein at least one of the different interchangeable motor modules in the stack is selectable for placement in the stack from other different interchangeable motor modules capable of placement in the stack.

The substrate transport apparatus of one or more of the above, wherein the drive section further comprises a can seal disposed between the motor stator and motor rotor of each motor module and hermetically sealing the respective motor stator and motor rotor from each other;

The substrate transport apparatus of one or more of the above, wherein the can seal spans across an interface between different interchangeable modules of the drive section.

The substrate transport apparatus of one or more of the above, wherein each of the different interchangeable motor modules has a different predetermined characteristic, independent of placement in the stack, the different predetermined characteristic of the module defining a different predetermined drive characteristic of the corresponding drive axis, independent of shaft spindle location, so that selection of the at least one motor module determines the different predetermined drive characteristic of the corresponding axis different from another of the independent drive axis The substrate transport apparatus of one or more of the above, wherein the stack height is variable where selection of the at least one module changes a height of the stack.

The substrate transport apparatus of one or more of the above, wherein the drive shaft spindle comprises a tri-axial spindle.

The substrate processing apparatus of one or more of the above, wherein at least one motor module is a compact height module where a module height of the compact height module is independent of the shaft spindle mechanical bearings.

The substrate processing apparatus of one or more of the above, wherein the drive section further includes a z carriage having connection to a top motor module and a bottom motor module of the stack.

The substrate processing apparatus of one or more of the above, wherein the motor modules are coupled to each other to form the stack and the coupled motor modules of the stack define the z carriage.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate transport apparatus comprising:
a frame; and
a drive section connected to the frame, the drive section including;
a multi-drive shaft spindle, with at least one coaxial shaft spindle;
at least one interchangeable composite motor module of more than one different interchangeable motor modules arranged in series, each different module in the series having a motor operably coupled to a corresponding shaft of the coaxial shaft spindle and defining a corresponding independent drive axis of the drive section, the motor of each module respectively having a motor stator, fixed to the frame, and a motor rotor joined to the corresponding shaft; and
a can seal disposed between the motor stator and motor rotor of each motor module and hermetically sealing the respective motor stator and motor rotor from each other;
wherein the at least one interchangeable composite motor module is selectable, for coupling to the co-axial shaft spindle, from other different interchangeable composite motor modules, capable of coupling to the co-axial shaft spindle, each having a different predetermined characteristic, independent of coupling to the co-axial shaft spindle, the different predetermined characteristic of the composite module defining a different predetermined drive characteristic of one or more of the corresponding drive axis, independent of shaft spindle location, so that selection of the at least one composite motor module determines a different predetermined drive characteristic of the co-axial shaft spindle.

2. The apparatus in claim 1, wherein selection of the at least one composite motor module determines the different predetermined drive characteristic of the corresponding axis different from another of the independent drive axis.

3. The substrate transport apparatus of claim 1, wherein the can seal spans across an interface between different interchangeable motor modules of the drive section.

4. The substrate transport apparatus of claim 1, wherein the coaxial shaft spindle comprises a tri-axial spindle.

5. The substrate processing apparatus of claim 1, wherein at least one of the motor modules has shaft spindle mechanical bearings that are nested within the respective stator.

6. The substrate processing apparatus of claim 5, wherein at least one of the motor modules is a compact height module where a module height of the compact height module is independent of the shaft spindle mechanical bearings.

7. A substrate transport apparatus comprising:
a frame; and
a drive section connected to the frame, the drive section including;
a drive shaft spindle with at least one drive shaft;
at least one interchangeable composite motor module of more than one interchangeable motor modules arranged in series, each different module in the series having a motor operably coupled to a corresponding drive shaft of the drive shaft spindle and defining a corresponding independent drive axis of the drive section, the motor of each module respectively having a motor stator, fixed to the frame, and a motor rotor joined to the corresponding shaft;
wherein the at least one interchangeable composite motor module is selectable, for coupling to the co-axial shaft spindle, from other interchangeable composite motor modules, capable of coupling to the co-axial shaft spindle; and
a linearly sliding carriage having a predetermined common coupling to the motor modules, the linearly sliding carriage having an adjustable length to effect coupling of the linearly sliding carriage to the co-axial shaft spindle.

8. The apparatus in claim 7, wherein selection of the at least one interchangeable composite motor module determines the different predetermined drive characteristic of the corresponding axis different from another of the independent drive axis.

9. The substrate transport apparatus of claim 7, wherein the more than one interchangeable motor modules arranged in series comprises two motor modules and the at least one drive shaft comprises two drive shafts, each drive shaft corresponding to a respective one of the two motor modules.

10. The substrate transport apparatus of claim 7, wherein the more than one interchangeable motor modules arranged in series comprises three motor modules and the at least one drive shaft comprises three drive shafts, each drive shaft corresponding to a respective one of the three motor modules.

11. The substrate transport apparatus of claim 7, further comprising a can seal disposed between the motor stator and motor rotor of each motor module and hermetically sealing the respective motor stator and motor rotor from each other.

12. The substrate transport apparatus of claim 7, wherein each motor module has a different predetermined characteristic, independent of coupling to the co-axial shaft spindle, the different predetermined characteristic of the composite module defining a different predetermined drive characteristic of one or more of the corresponding drive axis, independent of shaft spindle location, so that selection of the at least one composite motor module determines a different predetermined drive characteristic of the co-axial shaft spindle.

13. The substrate transport apparatus of claim 7, wherein selection of the motor modules defines a height of the linearly sliding carriage.

14. A substrate transport apparatus comprising:
a frame; and
a drive section connected to the frame, the drive section including;
  a drive shaft spindle with at least one drive shaft;
  at least one interchangeable composite motor module of more than one different interchangeable motor modules arranged in series, each different module in the series having a motor operably coupled to a corresponding drive shaft of the drive shaft spindle and defining a corresponding independent drive axis of the drive section, the motor of each module respectively having a motor stator, fixed to the frame, a motor rotor joined to the corresponding shaft, and shaft spindle mechanical bearings fixed to the frame where at least a portion of the shaft spindle mechanical bearings are nested within the stator; and
  wherein the at least one interchangeable composite motor module is selectable, for coupling to the co-axial shaft spindle, from other different interchangeable composite motor modules capable of coupling to the co-axial shaft spindle.

15. The apparatus in claim 14, wherein selection of the at least one interchangeable composite motor module determines the different predetermined drive characteristic of the corresponding axis different from another of the independent drive axis.

16. The substrate transport apparatus of claim 14, wherein the drive section further comprises a can seal disposed between the motor stator and motor rotor of each motor module and hermetically sealing the respective motor stator and motor rotor from each other.

17. The substrate transport apparatus of claim 16, wherein the can seal spans across an interface between different interchangeable motor modules of the drive section.

18. The substrate transport apparatus of claim 14, wherein each of the different interchangeable motor modules has a different predetermined characteristic, independent of coupling to the co-axial shaft spindle, the different predetermined characteristic of the composite module defining a different predetermined drive characteristic of one or more of the corresponding drive axis, independent of shaft spindle location, so that selection of the at least one composite motor module determines a different predetermined drive characteristic of the co-axial shaft spindle.

19. The substrate transport apparatus of claim 14, wherein the drive shaft spindle comprises a tri-axial spindle.

20. The substrate processing apparatus of claim 14, wherein at least one of the motor modules is a compact height module where a module height of the compact height module is independent of the shaft spindle mechanical bearings.

21. A method comprising:
providing a frame of a substrate transport apparatus;
providing a drive section connected to the frame, the drive section including: a multi-drive shaft spindle, with at least one coaxial shaft spindle, at least one interchangeable composite motor module of more than one different interchangeable motor modules arranged in series, each different module in the series having a motor operably coupled to a corresponding shaft of the coaxial shaft spindle and defining a corresponding independent drive axis of the drive section, the motor of each module respectively having a motor stator, fixed to the frame, and a motor rotor joined to the corresponding shaft, and a can seal disposed between the motor stator and motor rotor of each motor module and hermetically sealing the respective motor stator and motor rotor from each other; and
selecting the at least one interchangeable composite motor module, for coupling to the co-axial shaft spindle, from other different interchangeable composite motor modules, capable of coupling to the co-axial shaft spindle, each having a different predetermined characteristic, independent of coupling to the co-axial shaft spindle, the different predetermined characteristic of the composite module defining a different predetermined drive characteristic of one or more of the corresponding drive axis, independent of shaft spindle location, so that selection of the at least one composite motor module determines a different predetermined drive characteristic of the co-axial shaft spindle.

22. The apparatus in claim 21, wherein selection of the at least one interchangeable composite motor module determines the different predetermined drive characteristic of the corresponding axis different from another of the independent drive axis.

23. The method of claim 21, wherein the can seal spans across an interface between different interchangeable modules of the drive section.

24. The method of claim 21, wherein the coaxial shaft spindle comprises a tri-axial spindle.

25. The method of claim 21, wherein at least one of the motor modules has shaft spindle mechanical bearings that are nested within the respective stator.

26. The method of claim 25, wherein at least one of the motor modules is a compact height module where a module height of the compact height module is independent of the shaft spindle mechanical bearings.

* * * * *

UNITED STATES PATENT AND TRADEMARK OFFICE
CERTIFICATE OF CORRECTION

PATENT NO. : 11,276,598 B2  
APPLICATION NO. : 16/996409  
DATED : March 15, 2022  
INVENTOR(S) : Caveney Page 1 of 1

It is certified that error appears in the above-identified patent and that said Letters Patent is hereby corrected as shown below:

On the Title Page

Item (63) delete "filed as" and insert --filed on January 11, 2018, now Pat. No. 10,748,799, which is a 371 of".

Signed and Sealed this
Twenty-first Day of June, 2022

Katherine Kelly Vidal  
*Director of the United States Patent and Trademark Office*